US012615818B2

(12) United States Patent
Jeong et al.

(10) Patent No.: US 12,615,818 B2
(45) Date of Patent: Apr. 28, 2026

(54) SEMICONDUCTOR TRANSISTOR DEVICES INCLUDING ALTERNATIVELY STACKED SOURCE/DRAIN REGIONS

(71) Applicant: Samsung Electronics Co., Ltd., Suwon-si (KR)

(72) Inventors: Seojin Jeong, Suwon-si (KR); Jungtaek Kim, Suwon-si (KR); Moonseung Yang, Suwon-si (KR); Sumin Yu, Suwon-si (KR); Namkyu Cho, Suwon-si (KR); Seokhoon Kim, Suwon-si (KR); Pankwi Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 444 days.

(21) Appl. No.: 18/299,086

(22) Filed: Apr. 12, 2023

(65) Prior Publication Data
US 2023/0395662 A1 Dec. 7, 2023

(30) Foreign Application Priority Data
Jun. 7, 2022 (KR) ........................ 10-2022-0068904

(51) Int. Cl.
*H10D 62/10* (2025.01)
*H10D 30/67* (2025.01)

(52) U.S. Cl.
CPC ....... *H10D 62/121* (2025.01); *H10D 30/6735* (2025.01)

(58) Field of Classification Search
CPC .............. H10D 30/797; H10D 62/121; H10D 30/6735; H10D 62/832; H10D 30/6713
See application file for complete search history.

(56) References Cited

U.S. PATENT DOCUMENTS

| | | | |
|---|---|---|---|
| 9,287,398 B2 | 3/2016 | Kwok et al. | |
| 9,691,898 B2 | 6/2017 | Sung et al. | |
| 9,893,183 B2 | 2/2018 | Kuang et al. | |
| 10,381,438 B2 | 8/2019 | Zhang et al. | |
| 11,257,952 B2 | 2/2022 | Liu et al. | |
| 2015/0311140 A1 | 10/2015 | Kalnitsky et al. | |
| 2021/0057579 A1* | 2/2021 | Chen ................. | H01L 21/02587 |
| 2021/0257499 A1 | 8/2021 | Shin et al. | |

* cited by examiner

*Primary Examiner* — Changhyun Yi
(74) *Attorney, Agent, or Firm* — Wolf, Greenfield & Sacks, P.C.

(57) ABSTRACT

Semiconductor device may include an active region extending in a first direction, channel layers spaced apart from each other in a vertical direction, a gate structure extending on the active region and the channel layers to surround the channel layers and extending in a second direction, and a source/drain region on the active region adjacent to a side of the gate structure and contacting the plurality of channel layers. The source/drain region includes first to sixth epitaxial layers that are sequentially stacked in the vertical direction and have respective first to sixth germanium (Ge) concentrations. The first Ge concentration is lower than the second Ge concentration, the third Ge concentration is lower than the second Ge concentration and the fourth Ge concentration, and the fifth Ge concentration is lower than the fourth Ge concentration and the sixth Ge concentration.

19 Claims, 18 Drawing Sheets

100
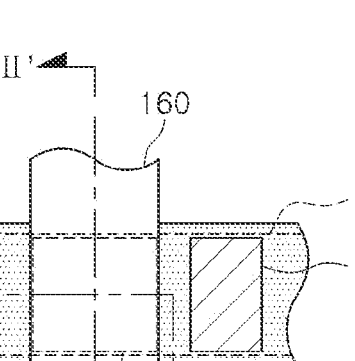
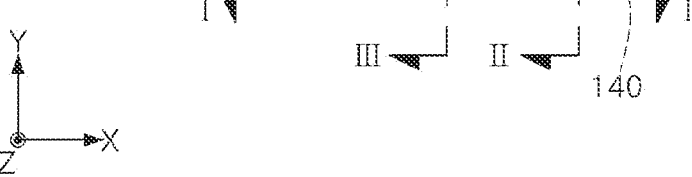
FIG. 1

1

SEMICONDUCTOR TRANSISTOR DEVICES INCLUDING ALTERNATIVELY STACKED SOURCE/DRAIN REGIONS

CROSS-REFERENCE TO RELATED APPLICATION(S)

This application claims priority under 35 U.S.C. § 119 to Korean Patent Application No. 10-2022-0068904 filed on Jun. 7, 2022 in the Korean Intellectual Property Office, the disclosure of which is incorporated herein by reference in its entirety.

BACKGROUND

The present inventive concept relates to semiconductor devices.

As demand for high performance, high speed, and/or multiple functions, and the like, of semiconductor devices increases, the degree of integration of semiconductor devices has similarly risen. In the fabrication of semiconductor devices having a fine pattern corresponding to higher integration trends in semiconductor devices, patterns having a narrow width or spacing may be formed. Furthermore, in order to overcome the limitations of operating characteristics due to the size reduction of a planar metal oxide semiconductor field effect transistor (MOSFET), efforts to develop semiconductor devices including FinFETs provided with a three-dimensional channel structure are underway.

SUMMARY

Example embodiments provide a semiconductor device having improved electrical characteristics.

According to an example embodiment, a semiconductor device includes: an active region extending in a first direction on a substrate; a plurality of channel layers to be spaced apart from each other in a vertical direction that is perpendicular to an upper surface of the substrate, on the active region; a gate structure extending on (e.g., traversing or intersecting) the active region and the plurality of channel layers to surround each of the plurality of channel layers on the substrate, and extending in a second direction; and a source/drain region on the active region adjacent to a side of the gate structure and contacting the plurality of channel layers. The source drain region includes: a first epitaxial layer on the active region to extend to contact the plurality of channel layers, including a recessed first upper surface, and having a first germanium (Ge) concentration; a second epitaxial layer on the first upper surface of the first epitaxial layer, including a recessed second upper surface, and having a second Ge concentration, higher than the first Ge concentration; a third epitaxial layer on the second upper surface of the second epitaxial layer, including a recessed third upper surface, and having a third Ge concentration, lower than the second Ge concentration; a fourth epitaxial layer on the third upper surface of the third epitaxial layer, including a recessed fourth upper surface, and having a fourth Ge concentration, higher than the third Ge concentration; a fifth epitaxial layer on the fourth upper surface of the fourth epitaxial layer, including a recessed fifth upper surface, and having a fifth Ge concentration, lower than the fourth Ge concentration; and a sixth epitaxial layer on the fifth upper surface of the fifth epitaxial layer to fill a gap of the fifth epitaxial layer, including a sixth upper surface, and having a sixth Ge concentration, higher than the fifth Ge concentration.

According to an example embodiment, a semiconductor device includes: an active region extending in a first direction on a substrate; a gate structure extending on (e.g., traversing or intersecting) the active region and extending in a second direction on the substrate; and a source/drain region on the active region adjacent to a side of the gate structure. The source/drain region includes: a first region including a plurality of epitaxial layers including first silicon-germanium (SiGe); and a second region including a plurality of insertion layers including second silicon-germanium (SiGe) and interposed between the plurality of epitaxial layers. A concentration of germanium (Ge), included in the first SiGe, is higher than a concentration of Ge included in the second SiGe. In some embodiments, the plurality of insertion layers are stacked alternately with the plurality of epitaxial layers. Further, in some embodiments, germanium concentrations in the plurality of epitaxial layers are higher than germanium concentrations in the plurality of insertion layers.

According to an example embodiment, a semiconductor device includes: an active region extending in a first direction on a substrate; a plurality of channel layers to be spaced apart from each other in a vertical direction that is perpendicular to an upper surface of the substrate, on the active region; a gate structure extending on (e.g., traversing or intersecting) the active region and the plurality of channel layers to surround the plurality of channel layers on the substrate, and extending in a second direction; and a source/drain region on the active region adjacent to a side of the gate structure and contacting the plurality of channel layers. The source/drain region includes first, second, third, fourth, fifth and sixth epitaxial layers that are sequentially stacked in the vertical direction and having respective first, second, third, fourth, fifth and sixth germanium (Ge) concentrations, the first Ge concentration is lower than the second Ge concentration, the third Ge concentration is lower than the second Ge concentration and the fourth Ge concentration, and the fifth Ge concentration is lower than the fourth Ge concentration and the sixth Ge concentration.

BRIEF DESCRIPTION OF DRAWINGS

The above and other aspects, features, and advantages of the present inventive concept will be more clearly understood from the following detailed description, taken in conjunction with the accompanying drawings.

FIG. 1 is a plan view of a semiconductor device according to example embodiments.

FIGS. 8A, 8B, 8C, 8D, 8E, 8F, 8G, 8H, 8I and 8J are cross-sectional views illustrating a method of manufacturing a semiconductor device according to example embodiments.

DETAILED DESCRIPTION

Figure 2:
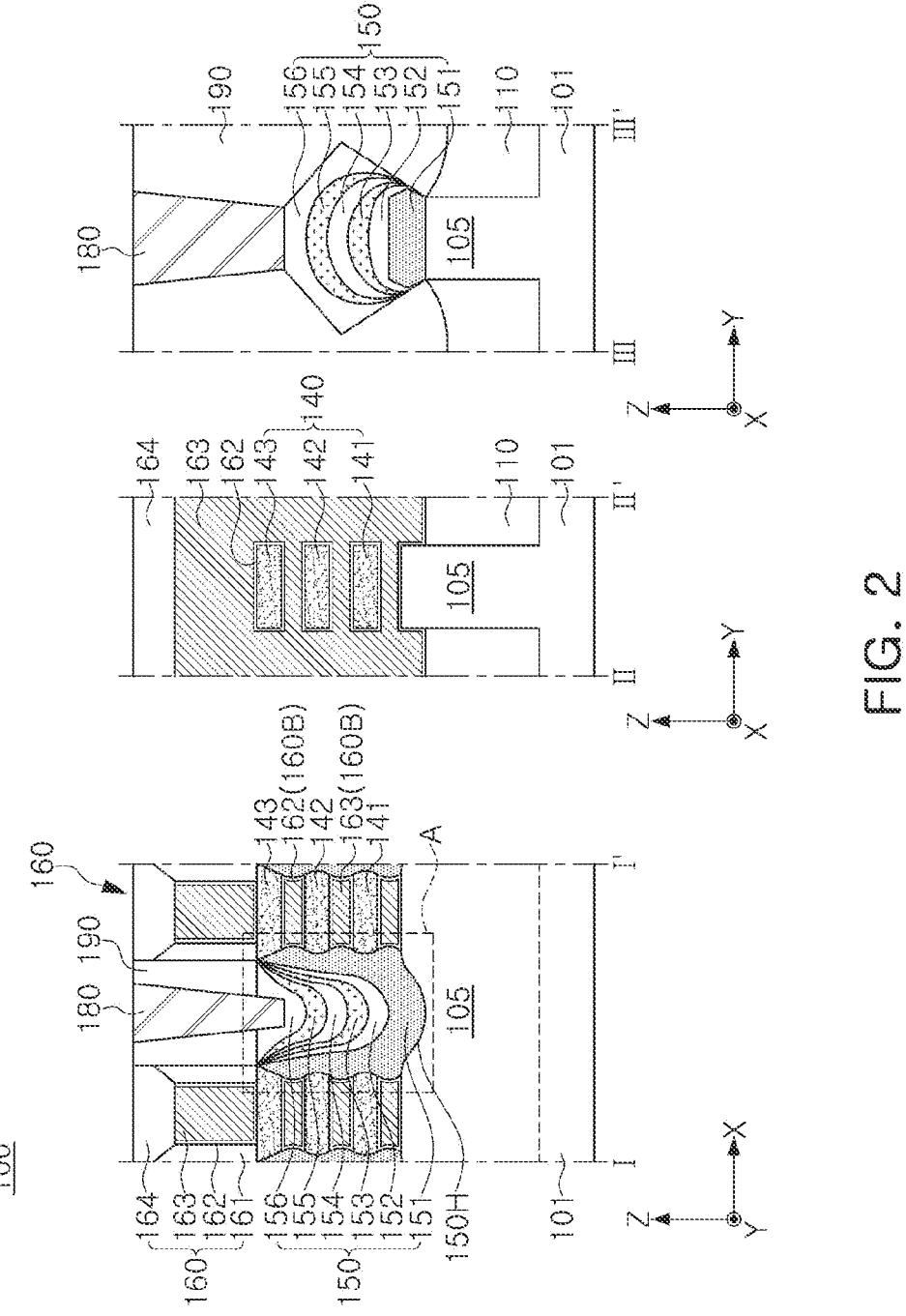
FIG. 2 shows cross-sectional views of a semiconductor device according to example embodiments.

Hereinafter, example embodiments will be described as follows with reference to the accompanying drawings.

Hereinafter, the terms such as "upper," "upper portion," "upper surface," "lower," "lower portion," and "lower surface" may be indicated by reference numerals based on the drawings unless otherwise indicated. The terms such as "upper portion," "intermediate portion," and "lower portion" may be replaced with other terms such as "first," "second," and "third," for example, and may be used to describe elements of example embodiments. The terms such as "first," "second," and "third" may be used to describe elements, but the elements are not limited by the terms, and may also be referred to as "first element," "second element," and "third element." Unless the context indicates otherwise, these terms are only used to distinguish one element, component, region, layer, or section from another element, component, region, layer, or section, for example as a naming convention. In addition, in certain cases, even if a term is not described using "first," "second," "third," etc., in the specification, it may still be referred to as "first," "second," or "third" in claims in order to distinguish different claimed elements from each other.

As used herein, an element or region that is "covering" or "surrounding" or "filling" another element or region may completely or partially cover or surround or fill the other element or region.

FIG. 1 is a plan view of a semiconductor device according to example embodiments.

FIG. 2 shows cross-sectional views of a semiconductor device according to example embodiments. Specifically, FIG. 2 shows cross-sections of the semiconductor device of FIG. 1 taken along lines I-I', II-II', and III-III', respectively.

Figure 3:
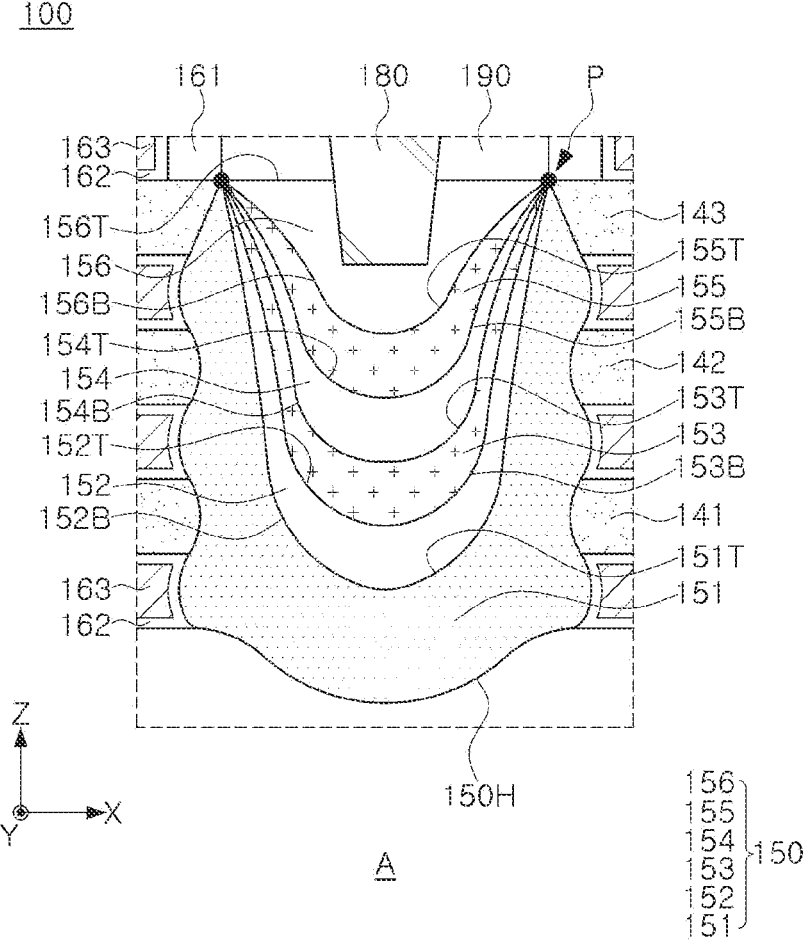
FIG. 3 is a partially enlarged view illustrating a portion of a semiconductor device according to example embodiments.

FIG. 3 is an enlarged view of a portion of a semiconductor device according to example embodiments. Specifically, FIG. 3 is an enlarged view of the region "A" of FIG. 2.

For ease of description, only a group of components (e.g., major components) of the semiconductor device are illustrated in FIGS. 1 to 3.

Referring to FIGS. 1 to 3, a semiconductor device 100 may include a substrate 101, an active region 105 on the substrate 101, a channel structure 140 including a plurality of channel layers 141, 142, and 143 vertically spaced apart from each other on the active region 105, a source/drain region 150 contacting the plurality of channel layers 141, 142, and 143, a gate structure 160 extending on (e.g., traversing or intersecting) the active region 105, and a contact plug 180 connected to the source/drain region 150. The semiconductor device 100 may further include isolation layers 110 and an interlayer insulating layer 190. The gate structure 160 may include a spacer layer 161, a gate dielectric layer 162, a gate electrode layer 163, and a gate capping layer 164. As used herein, "an element A connected to an element B" (or similar language) means that the element A is electrically connected to the element B and/or the element A contacts the element B.

In the semiconductor device 100, the active region 105 may have a fin structure, and the gate electrode layer 163 may be disposed between the active region 105 and the channel structure 140, between the plurality of channel layers 141, 142, and 143 of the channel structure 140, and on the channel structure 140. Accordingly, the semiconductor device 100 may include a gate-all-around type field effect transistor formed by the channel structure 140, the source/drain regions 150, and the gate structure 160, for example, a multi-bridge channel FET (MBCFET™). The transistor may be, for example, PMOS transistors.

The substrate 101 may have an upper surface extending in an X-direction (also referred to as a first direction or a first horizontal direction) and a Y-direction (also referred to as a second direction or a second horizontal direction). The substrate 101 may include a semiconductor material, for example, a group IV semiconductor, a group III-V compound semiconductor, and/or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like. As used herein the term "and/or" includes any and all combinations of one or more of the associated listed items.

The isolation layer 110 may define the active region 105 in the substrate 101. The isolation layer 110 may be formed by, for example, a shallow trench isolation (STI) process. According to example embodiments, the isolation layer 110 may further include a region having a step with respect to a lower portion of the substrate 101 and extending deeper. The isolation layer 110 may expose a portion of an upper portion of the active region 105. In example embodiments, the isolation layer 110 may have a curved upper surface having a level increased in a direction toward the active region 105. The isolation layer 110 may be formed of an insulating material. The device isolation layer 110 may be, for example, an oxide, a nitride, and/or a combination thereof. As used herein, "a surface/portion A is lower than a surface/portion B" (or similar language) means that the surface/portion A is closer than the surface/portion B to the substrate 101.

The active region 105 may be defined by the isolation layer 110 in the substrate 101 and may be disposed to extend in a first direction X. The active region 105 may have a structure protruding from the substrate 101. An upper end of the active region 105 may be disposed to protrude to a predetermined height from an upper surface of the isolation layer 110. The active region 105 may be formed as a portion of the substrate 101, or may include an epitaxial layer grown from the substrate 101. However, a portion of the active region 105 on the substrate 101 may be recessed on opposite sides of the gate structures 160, and the source/drain regions 150 may be disposed on the recessed active region 105. The active region 105 may include impurities or doped regions including impurities. As used herein, "an element A extends in a direction X" (or similar language) may mean that the element A extends longitudinally in the direction X.

The channel structure 140 may include two or more channel layers, first to third channel layers 141, 142, and 143, disposed on the active region 105 to be spaced apart from each other in a direction that is perpendicular to an upper surface of the active region 105, for example, in a Z-direction (also referred to as a third direction or a vertical direction). The first to third channel layers 141, 142, and 143 may be connected to the source/drain region 150 and may be spaced apart from the upper surface of the active region 105. The first to third channel layers 141, 142, and 143 may have a width the same as or similar to a width of the active region 105 in the Y-direction, and may have a width the same as or similar to a width of the gate structure 160 in the X-direction. In example embodiments, the first to third channel layers 141, 142, and 143 may have a decreased width such that side surfaces thereof are disposed below the gate structure 160 in the X-direction.

The first to third channel layers 141, 142, and 143 may be formed of a semiconductor material and may include, for example, silicon (Si). The first to third channel layers 141, 142, and 143 may be formed of, for example, the same material as the substrate 101. The number and shape of the channel layers 141, 142, and 143, constituting a single channel structure 140, may vary according to example embodiments. For example, in example embodiments, the channel structure 140 may further include a channel layer disposed on the upper surface of the active region 105.

The source/drain region 150 may be disposed on the active region 105 adjacent to at least one side of the gate structure 160. The source/drain region 150 may be disposed in a recessed region recessed from the upper surface of the active region 105. In a shape of the recessed region of the active region 105, the degree of downward convexity may vary according to example embodiment. Accordingly, a shape of the source/drain region 150 formed in the recess region of the active region 105 may also vary.

The source/drain region 150 may include a plurality of epitaxial layers. In example embodiments, the source/drain region 150 may include first, second, third, fourth, fifth and sixth epitaxial layers 151, 152, 153, 154, 155, and 156. All of the first to sixth epitaxial layers 151, 152, 153, 154, 155, and 156 may be semiconductor layers including, for example, silicon (Si) and germanium (Ge). Each of the first to sixth epitaxial layers 151, 152, 153, 154, 155, and 156 may include impurities.

The first epitaxial layer 151 may be disposed on the active region 105 and may extend to contact the plurality of channel layers 141, 142, and 143. The first epitaxial layer 151 may be formed along the source/drain hole 150H. The first epitaxial layer 151 may have a substantially U-shape and may have a first upper surface 151T having a recessed shape.

The first epitaxial layer 151 may contact a lower portion 160B of the gate structure 160 disposed below each of the channel layers 141, 142, and 143. The first epitaxial layer 151 may include a protrusion protruding toward the gate structure 160 on the same level as the lower portion 160B of the gate structure 160. In example embodiments, a side surface of the lower portion 160B of the gate structure 160 in the first direction X may be recessed to a predetermined depth to have an inwardly concave shape. The protrusion of the first epitaxial layer 151 may be disposed in a recessed region of the lower portion 160B of the gate structure 160. A width of the first epitaxial layer 151 in the first direction X on the level of the gate structure 160 may be greater than a width of the first epitaxial layer 151 in the first direction X on the level of the first to third channel layers 141, 142, and 143.

A surface of the first epitaxial layer 151, contacting the plurality of channel layers 141, 142, and 143 and the lower portion 160B of the gate structure 160, may have a wavy shape, but example embodiments are not limited thereto. The shape of the first epitaxial layer 151 may vary depending on the shape of the channel structure 140, the shape of the gate structure 160, and the like. In other embodiments, when the semiconductor device further includes an external spacer on an external side of the gate electrode layer 163 of the lower portion 160B, an external surface of the first epitaxial layer 151 may have a gently curved shape.

The second epitaxial layer 152 may be disposed on the first epitaxial layer 151. A lower surface 152B (also referred to as a second lower surface) of the second epitaxial layer 152 may contact the first upper surface 151T of the first epitaxial layer 151. In example embodiments, an entire region of the lower surface 152B of the second epitaxial layer 152 may contact an entire region of the first upper surface 151T of the first epitaxial layer 151. The second epitaxial layer 152 may have a recessed upper surface 152T (also referred to as a second upper surface). The second epitaxial layer 152 may have an upper surface 152T and a lower surface 152B having a substantially U-like rounded shape.

The third epitaxial layer 153 may be disposed on the second epitaxial layer 152. A lower surface 153B (also referred to as a third lower surface) of the third epitaxial layer 153 may contact the upper surface 152T of the second epitaxial layer 152. In example embodiments, an entire region of the lower surface 153B of the third epitaxial layer 153 may contact an entire region of the upper surface 152T of the second epitaxial layer 152. The third epitaxial layer 153 may have a recessed upper surface 153T (also referred to as a third upper surface). The third epitaxial layer 153 may have an upper surface 153T and a lower surface 153B having a substantially U-like rounded shape.

The fourth epitaxial layer 154 may be disposed on the third epitaxial layer 153. A lower surface 154B (also referred to as a fourth lower surface) of the fourth epitaxial layer 154 may contact the upper surface 153T of the third epitaxial layer 153. In example embodiments, an entire region of the lower surface 154B of the fourth epitaxial layer 154 may contact an entire region of the upper surface 153T of the third epitaxial layer 153. The fourth epitaxial layer 154 may have a recessed upper surface 154T (also referred to as a fourth upper surface). The fourth epitaxial layer 154 may have an upper surface 154T and a lower surface 154B having a substantially U-like rounded shape.

The fifth epitaxial layer 155 may be disposed on the fourth epitaxial layer 154. A lower surface 155B (also referred to as a fifth lower surface) of the fifth epitaxial layer 155 may contact the upper surface 154T of the fourth epitaxial layer 154. In example embodiments, an entire region of the lower surface 155B of the fifth epitaxial layer 155 may contact an entire region of the upper surface 154T of the fourth epitaxial layer 154. The fifth epitaxial layer 155 may have a recessed upper surface 155T (also referred to as a fifth upper surface). The fifth epitaxial layer 155 may include an upper surface 155T and a lower surface 155B having a substantially U-like rounded shape.

The sixth epitaxial layer 156 may be disposed on the fifth epitaxial layer 155. The sixth epitaxial layer 156 may fill a gap of the fifth epitaxial layers 155. The sixth epitaxial layer 156 may be provided in (e.g., may fill) a space defined by the upper surface 155T of the fifth epitaxial layers 155. A lower surface 156B (also referred to as a sixth lower surface) of the sixth epitaxial layer 156 may contact the upper surface 155T of the fifth epitaxial layer 155. In example embodiments, an entire region of the lower surface 156B of the sixth epitaxial layer 156 may contact an entire region of the upper surface 155T of the fifth epitaxial layer 155. The sixth epitaxial layer 156 (e.g., an upper surface 156T of the sixth epitaxial layer 156) may be disposed on the same level as an upper surface of the uppermost channel layer 143, and may include a substantially planar upper surface 156T (also referred to as a sixth upper surface). However, the shape and location of the upper surface 156T of the sixth epitaxial layer 156 are not limited thereto. In other embodiments, the sixth epitaxial layer 156 may have a downwardly concave upper surface, or may have an upper surface disposed on a level higher than a level of the upper surface of the uppermost channel layer 143. The sixth epitaxial layer 156 may have lower surface 156B having a substantially U-like rounded shape. Each of the first, second, third, fourth and fifth upper surfaces 151T, 152T, 153T, 154T and 155T may be curved toward the substrate 101, as illustrated in FIGS. 2 and 3.

Each of the second to fifth epitaxial layers 152, 153, 154, and 155 may have a maximum thickness in the vertical direction Z, in a central portion in the first direction X. Accordingly, the sixth epitaxial layer 156 filling the gap of the fifth epitaxial layer 155 may have an aspect ratio, smaller than that an aspect ratio of the source/drain hole 150H. In example embodiments, each of the second to fifth epitaxial layers 152, 153, 154, and 155 may have a vertical thickness increased in a direction toward the central portion in the first direction X. In example embodiments, thicknesses of the second to fifth epitaxial layers 152, 153, 154, and 155 in the central portions in the first direction X may be the same or different from each other. Each of the second to fifth epitaxial layers 152, 153, 154, and 155 may include a center portion in the first direction X, and that center portion of each of the second to fifth epitaxial layers 152, 153, 154, and 155 may have a thickest thickness of the respective second to fifth epitaxial layers 152, 153, 154, and 155, as illustrated in FIG. 3.

The sixth epitaxial layer 156 has an aspect ratio, lower than an aspect ratio of the source/drain hole 150H, so that occurrence of dislocation or formation of voids in the source/drain region 150 may be suppressed. Accordingly, electrical characteristics and reliability of the semiconductor device 100 may be improved.

An epitaxial layer, formed within the source/drain region 150, may have a crystal growth rate varying depending on a crystal direction. For example, the epitaxial layer constituting the source/drain region 150 may have a relatively low growth rate in the vertical direction Z, as compared to that in the horizontal direction X. When the epitaxial layer is formed in the source/drain hole 150H, growth thereof in the vertical direction may not be completed until growth thereof in the horizontal direction is completed. Accordingly, dislocation may occur or voids may be formed in the source/drain region 150. As a contacted polysilicon pitch (CPP) between adjacent gate structures is decreased, and the aspect ratio of the source/drain hole 150H is increased to increase the degree of integration of the semiconductor device, probability of occurrence of defects in the source/drain regions 150 may be increased.

The defects, occurring in the source/drain region 150, may deteriorate electrical performance of the semiconductor device. For example, when the semiconductor device 100 is a PMOS, the epitaxial layers having a high germanium (Ge) concentration may act as a stressor applying compressive force to the channel layers 141, 142, and 143 to increase charge mobility in the channel layers 141, 142, and 143. However, when dislocation occurs in the source/drain region 150, strain relaxation may occur in a region in which an interatomic bond is broken. Accordingly, since the source/drain region 150 is incapable of applying sufficient compressive stress to the channel layers 141, 142, and 143, the performance of the semiconductor device may be deteriorated due to an increase in resistance of the channel layers 141, 142, and 143.

The source/drain region 150 according to example embodiments may include second to fifth epitaxial layers 152 to 155 having a maximum thickness in a central portion in the first direction X. Accordingly, the aspect ratio of the sixth epitaxial layer 156 filling the gap of the fifth epitaxial layers 155 may be reduced. Accordingly, defects caused by the dislocation or the voids in the sixth epitaxial layer 156 may be suppressed. As a result, defects occurring in the source/drain region 150 may be suppressed without limiting a device CPP to improve the performance of the semiconductor device.

In example embodiments, the first to fifth epitaxial layers 151, 152, 153, 154, 155 may meet at a first point P. For example, uppermost ends of the first to fifth epitaxial layers 151, 152, 153, 154, and 155 may meet at the first point P. The first point P may be disposed on the same level as the upper surface 156T of the sixth epitaxial layer 156.

The first to sixth epitaxial layers 151, 152, 153, 154, 155, and 156 may have a discontinuous germanium (Ge) concentration in a boundary between continuously disposed layers. The first to sixth epitaxial layers 151, 152, 153, 154, 155, and 156 may include first to sixth germanium (Ge) concentrations, respectively. The first Ge concentration of the first epitaxial layer 151 may be lower than the second Ge concentration of the second epitaxial layer 152. The second Ge concentration of the second epitaxial layer 152 may be higher than the third Ge concentration of the third epitaxial layer 153. The third Ge concentration of the third epitaxial layer 153 may be lower than the fourth Ge concentration of the fourth epitaxial layer 154. The fourth Ge concentration of the fourth epitaxial layer 154 may be higher than the fifth Ge concentration of the fifth epitaxial layer 155. The fifth Ge concentration of the fifth epitaxial layer 155 may be lower than the sixth Ge concentration of the sixth epitaxial layer 156. The germanium (Ge) concentrations of the first to sixth epitaxial layers 151 to 156 will be described later with reference to FIGS. 4A and 4B.

The gate structure 160 may be disposed to extend in one direction, for example, the Y-direction and to extend on (e.g., traverse or intersect) the active region 105 and the channel structures 140 on the active region 105 and the channel structures 140. Channel regions of transistors may be formed in the active region 105 and the channel structures 140 intersecting the gate structure 160. The gate structure 160 may include a gate electrode layer 163, a gate dielectric layer 162 between the gate electrode layer 163 and the plurality of channel layers 141, 142, and 143, spacer layers 161 on side surfaces of the gate electrode layer 163, and a gate capping layer 164 on an upper surface of the gate electrode layer 163.

The gate dielectric layer 162 may be disposed between the active region 105 and the gate electrode 163 and between the channel structure 140 and the gate electrode 163, and may be disposed to cover at least a portion of surfaces of the gate electrode 165. For example, the gate dielectric layer 162 may be disposed to surround all surfaces of the gate electrode 165, other than the upper surface of the gate electrode 163. The gate dielectric layer 162 may extend between the gate electrode 163 and the spacer layers 161, but the extension of the gate dielectric layer 162 is not limited thereto. The gate dielectric layer 162 may include an oxide, a nitride, and/or a high-κ dielectric material. The high-κ dielectric material may refer to a dielectric material having a dielectric constant, higher than a dielectric constant of a silicon oxide ($SiO_2$). The high-κ dielectric material may include or may be one of, for example, an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and/or a praseodymium oxide ($Pr_2O_3$).

The gate electrode 163 may be disposed to extend upwardly of the channel structure 140 while filling spaces between the plurality of channel layers 141, 142, and 143 on the active region 105. The gate electrode 163 may be spaced apart from the plurality of channel layers 141, 142, and 143 by the gate dielectric layer 162. The gate electrode 163 may include a conductive material. For example, the gate electrode 163 may include a metal nitride (for example, a titanium nitride (TiN), a tantalum nitride (TaN), and/or a tungsten nitride (WN)), a metal material (for example, aluminum (Al), tungsten (W), and/or molybdenum (Mo)), and/or a semiconductor material (for example, doped poly-silicon).

The gate electrode layer 163 may have a multilayer structure including two or more layers. The spacer layers 161 may be disposed on opposite side surfaces of the gate electrode 163. The spacer layers 161 may insulate the source/drain regions 150 and the gate electrode layer 163 from each other. In example embodiments, the spacer layers 161 may have a multilayer structure. The spacer layers 161 may include, for example, an oxide, a nitride, an oxynitride, and/or a low-x dielectric material.

The gate capping layer 164 may be disposed on the gate electrode layer 163, and a lower surface of the gate capping layer 164 may be surrounded by the gate electrode layer 163 and the spacer layers 161.

The interlayer insulating layer 190 may be disposed to cover the source/drain region 150, the gate structure 160, and the isolation layer 110. The interlayer insulating layer 190 may include, for example, an oxide, a nitride, an oxynitride, and/or a low-x dielectric material.

The contact plug 180 may penetrate through the interlayer insulating layer 190 to be connected to the source/drain region 150, and may apply an electrical signal to the source/drain region 150. The contact plug 180 may be disposed on the source/drain region 150. In an example embodiment, the contact plug 180 may be disposed to have a length, greater than a length of the source/drain region 150 in the Y-direction. The contact plug 180 may have an inclined side surface in which a width of a lower portion is narrower than a width of an upper portion depending on an aspect ratio, but a shape of the side surface of the contact plug 180 is not limited thereto. The contact plug 180 may be disposed to recess the source/drain region 150 to a prede-termined depth. In example embodiments, the contact plug 180 may be disposed to penetrate through the fourth epi-taxial layer 154 and to penetrate through at least a portion of the third epitaxial layer 153. The contact plug 180 may include, for example, a metal nitride (for example, a titanium nitride (TiN), a tantalum nitride (TaN), and/or a tungsten nitride (WN)) and a metal material (for example, aluminum (Al), tungsten (W), and/or molybdenum (Mo)).

Next, the germanium (Ge) concentrations of the first to sixth epitaxial layers 151 to 156 of the source/drain region 150 will be described with reference to FIGS. 4A and 4B.

Figure 4A:
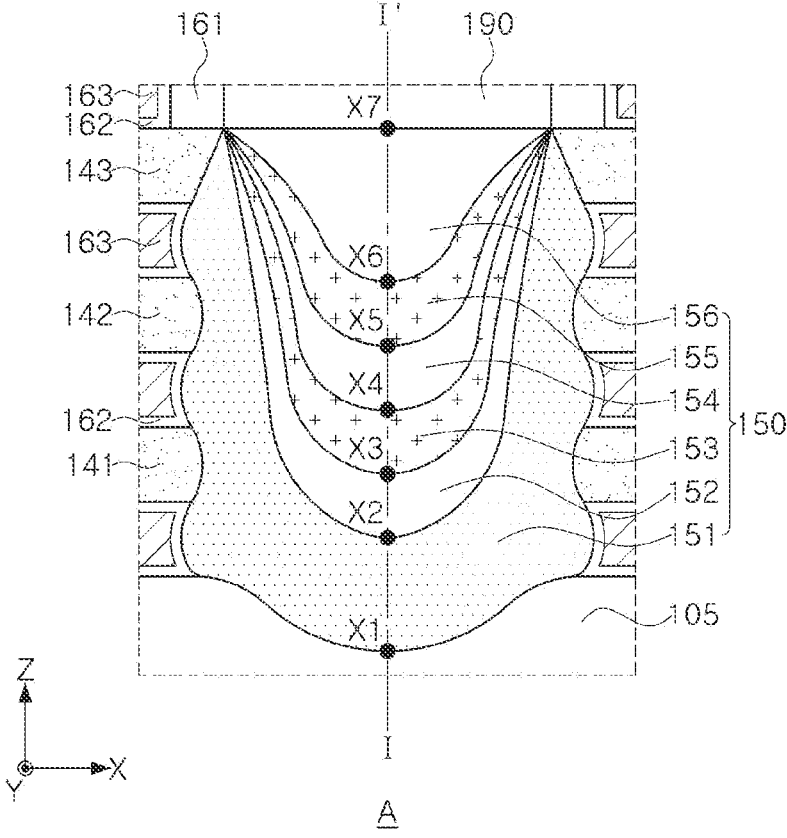
FIG. 4A is an enlarged view of a portion of a semiconductor device according to example embodiments.

FIG. 4A is an enlarged view of a portion of a semicon-ductor device according to example embodiments. For ease of description, the contact plug 180 in FIG. 3 is not shown in FIG. 4A.

Figure 4B:
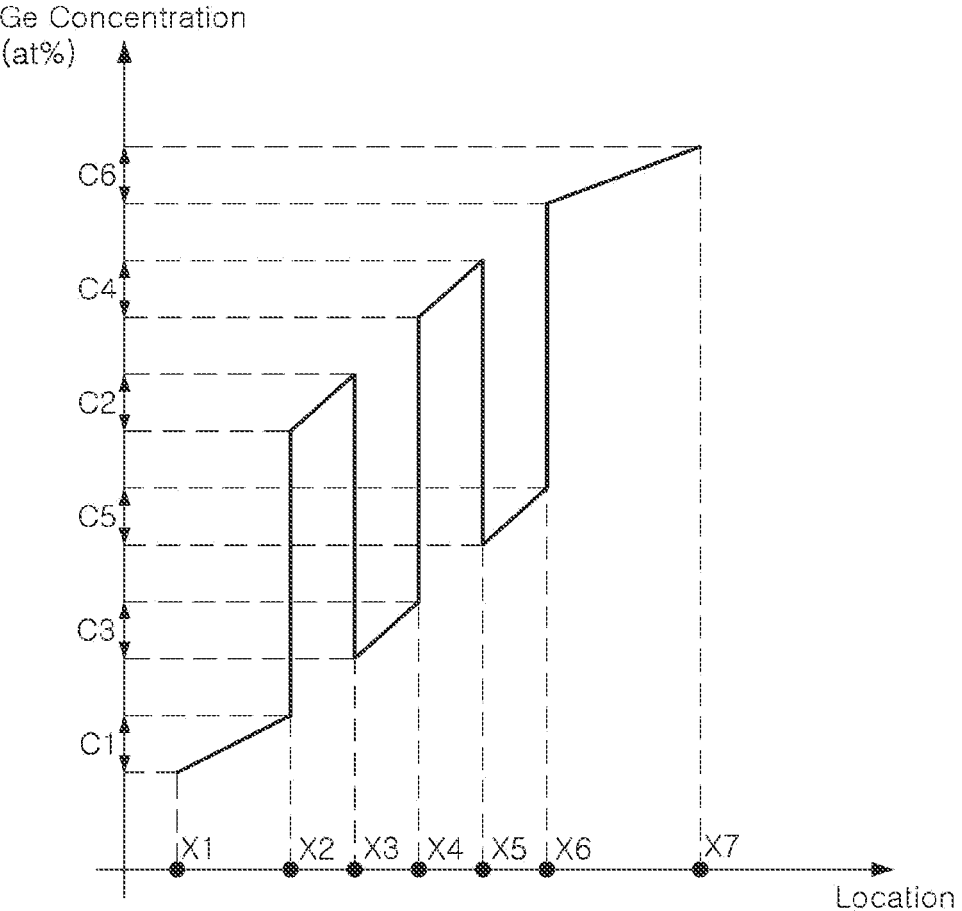
FIG. 4B is a diagram illustrating a germanium concentration in a source/drain region of a semiconductor device according to example embodiments.

FIG. 4B is a diagram illustrating a distribution of germa-nium (Ge) concentration in a source/drain region in a semiconductor device according to example embodiments. FIG. 4B is a schematic diagram illustrating a concentration profile of germanium (Ge) in the source/drain region 150 along I-I' of FIG. 4A.

Referring to FIGS. 4A and 4B, in FIG. 4A, I-I' is a center line of a source/drain region 150 in a first direction X. In FIG. 4B, a period X1-X2 corresponds to the first epitaxial layer 151, a period X2-X3 corresponds to the second epitaxial layer 152, a period X3-X4 corresponds to the third epitaxial layer 153, a period X4-X5 corresponds to the fourth epitaxial layer 154, a period X5-X6 corresponds to the fifth epitaxial layer 155, and a period X6-X7 corresponds to the sixth epitaxial layer 156.

Each of the first to sixth epitaxial layers 151, 152, 153, 154, 155, and 156 may be a semiconductor layer including silicon (Si) and germanium (Ge). The first to sixth epitaxial layers 151, 152, 153, 154, 155, and 156 may have first to sixth germanium (Ge) concentrations C1, C2, C3, C4, C5, and C6, respectively. The germanium (Ge) concentration may be discontinuous in boundaries between continuous epitaxial layers.

The first Ge concentration C1 of the first epitaxial layer 151 may be lower than the second Ge concentration C2 of the neighboring second epitaxial layer 152. In example embodiments, the first Ge concentration C1 of the first epitaxial layer 151 may be about 5 atomic percent (at %) to about 8 at %. When the first epitaxial layer 151 has the first Ge concentration within the above-mentioned range, stress caused by a difference in lattice constants between silicon (Si) and germanium (Ge) may be reduced.

The second Ge epitaxial layer 152 may have the second Ge concentration C2 that is higher than the first Ge concen-tration C1 of the neighboring first epitaxial layer 151 and the third Ge concentration C3 of the neighboring third epitaxial layer 153. The fourth epitaxial layer 154 may have the fourth Ge concentration G4 that is higher than the third Ge con-centration C3 of the neighboring third epitaxial layer 153 and the fifth Ge concentration C5 of the neighboring fifth epitaxial layer 155. The sixth epitaxial layer 156 may have the sixth Ge concentration C6 that is higher than the fifth Ge concentration C5 of the neighboring fifth epitaxial layer 155. In example embodiments, each of the second Ge concen-tration C2 of the second epitaxial layer 152, the fourth Ge concentration C4 of the fourth epitaxial layer 154, and the sixth Ge concentration G6 of the sixth epitaxial layer 156 may be about 30 at % to about 70 at %.

The third epitaxial layer 153 may have the third Ge concentration C3 that is lower than the second Ge concen-tration C2 of the neighboring second epitaxial layer 152 and the fourth Ge concentration C4 of the neighboring fourth epitaxial layer 154. The fifth epitaxial layer 155 may have the fifth Ge concentration G5 that is lower than the fourth Ge concentration C4 of the neighboring fourth epitaxial layer 154 and the sixth Ge concentration C6 of the neighboring sixth epitaxial layer 156.

The second epitaxial layer 152, the fourth epitaxial layer 154, and the sixth epitaxial layer 156, respectively contain-ing a relatively high concentration of germanium (Ge) as compared with neighboring layers, may constitute a first region of the source/drain region 150. The third epitaxial layer 153 and the fifth epitaxial layer 155, interposed between e epitaxial layers of the first region and containing a relatively low concentration of germanium (Ge) as com-pared with neighboring layers, may constitute a second region of the source/drain region 150. The first region may include first silicon-germanium (SiGe), and the second region may include second silicon-germanium (SiGe). A concentration of germanium (Ge) included in the first sili-con-germanium (SiGe) may be higher than a concentration of germanium (Ge) included in the second silicon-germa-nium (SiGe). In the specification, the epitaxial layer included in the second region may be referred to as an "insertion layer."

In FIGS. 1 to 3, 4A and 4B, the first region of the source/drain region 150 is illustrated as including three epitaxial layers (second, fourth and sixth epitaxial layers 152, 154, and 156), and the second region is illustrated as including two epitaxial layers (third and fifth epitaxial layers 153 and 155), but example embodiments are not limited thereto. Each of the first region and the second region of the source/drain region 150 may include a plurality of epitaxial layers. For example, the second region of the source/drain region 150 may include two or more to 50 or less epitaxial layers.

The third epitaxial layer 153 and the fifth epitaxial layer 155 may be formed in a reflow process of the second epitaxial layer 152 and the fourth epitaxial layer 154. For example, the second epitaxial layer 152 may be conformally formed on the first epitaxial layer 151 to have a uniform thickness. Then, the second epitaxial layer 152 and the third epitaxial layer 153 may be reflowed by a process of applying heat, or the like, at the same time as the third epitaxial layer 153 may be formed on the second epitaxial layer 152. Accordingly, the second epitaxial layer 152 and the third epitaxial layer 153 may have a maximum thickness in a central portion in the first direction X.

Similarly, the fourth epitaxial layer 154 may be conformally formed on the third epitaxial layer 153 to have a uniform thickness. Then, the fourth epitaxial layer 154 and the fifth epitaxial layer 155 may be reflowed by a process of applying heat, or the like, at the same time as the fifth epitaxial layer 155 may be formed on the fourth epitaxial layer 154. Accordingly, the fourth epitaxial layer 154 and the fifth epitaxial layer 155 may have a maximum thickness in the central portion in the first direction X.

Germanium (Ge) source gas may not be supplied in the process of forming the third and fifth epitaxial layers 153 and 155 performed together with the reflow process. The other process conditions may be maintained to be the same as or similar to process conditions for forming the second and fourth epitaxial layers 152 and 154. Accordingly, the third and fifth epitaxial layers 153 and 155 may have a germanium (Ge) concentration that is lower than a Ge concentration of the neighboring epitaxial layers, and may have a discontinuous germanium (Ge) concentration in boundaries with the neighboring epitaxial layers.

Each of the first to sixth Ge concentrations C1, C2, C3, C4, C5, and C6 of the first to sixth epitaxial layers 151, 152, 153, 154, 155, and 156 may have a profile increased in a direction toward an upper surface of the source/drain region 150. However, the concentration profiles of the first to sixth epitaxial layers 151, 152, 153, 154, 155, and 156 are not limited thereto. In other embodiments, the first to sixth Ge concentrations C1, C2, C3, C4, C5, and C6 may have constant values in the first to sixth epitaxial layers 151, 152, 153, 154, 155, and 156, respectively.

As described above, the first to sixth epitaxial layers 151, 152, 153, 154, 155, and 156 have different material compositions (for example, Ge concentrations), and thus may be substantially distinguished from each other through analysis such as transmission electron microscopy energy-dispersive X-ray spectroscopy (TEM-EDX), or the like.

Figure 5:
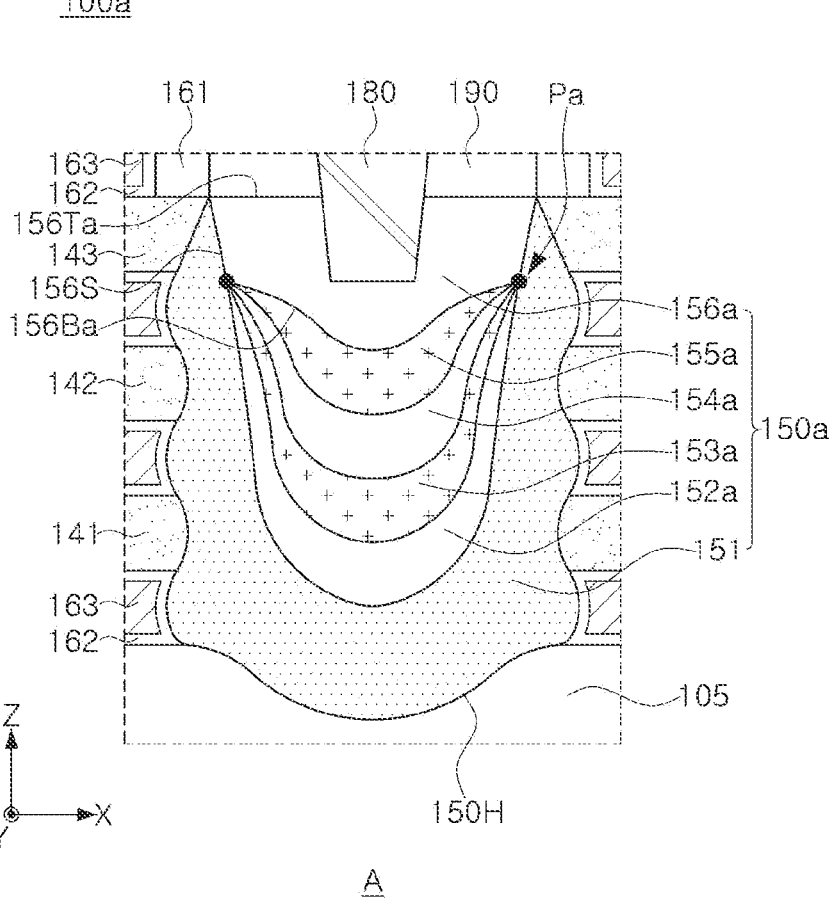
FIG. 5 is a cross-sectional view of a semiconductor device according to example embodiments.
Figure 6:
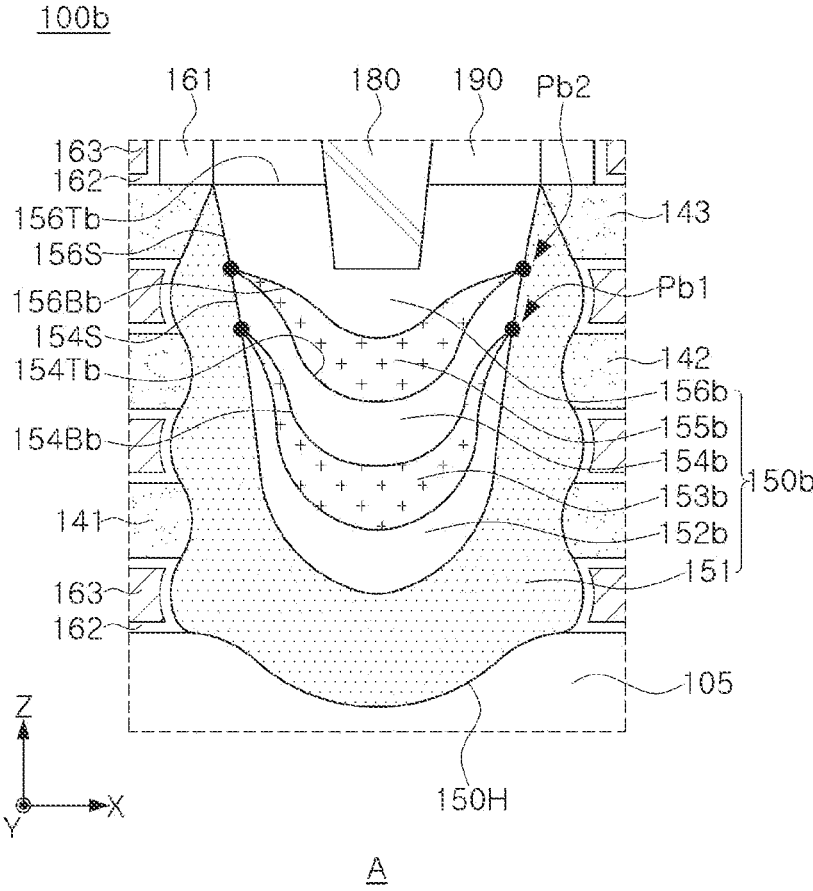
FIG. 6 is a cross-sectional view of a semiconductor device according to example embodiments.
Figure 7:
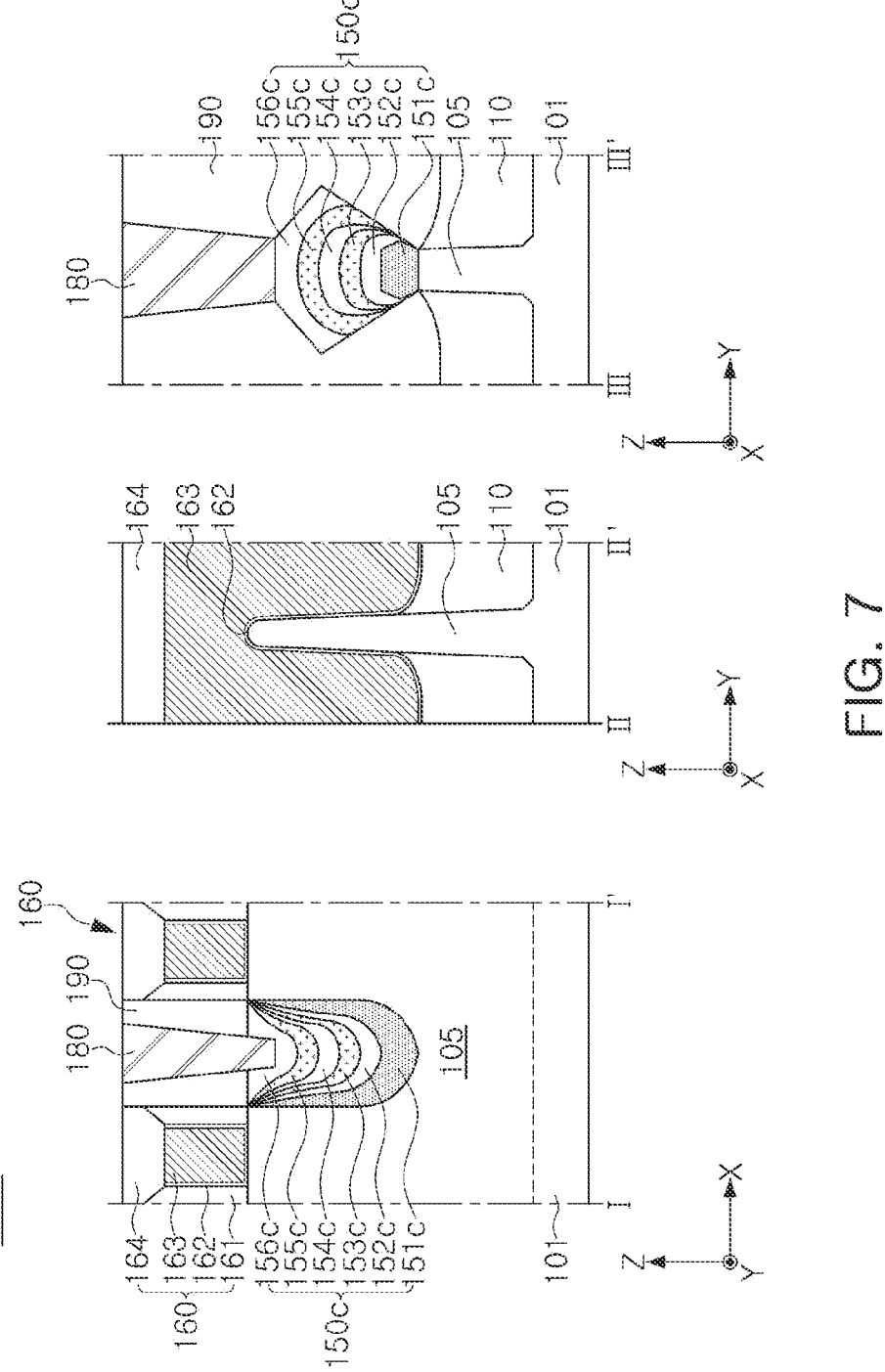
FIG. 7 is a cross-sectional view of a semiconductor device according to example embodiments.

FIGS. 5 to 7 are cross-sectional views of semiconductor devices according to example embodiments, respectively.

In the example embodiment of FIGS. 5 to 7, in the case in which reference numerals are the same as those of FIGS. 1 to 3 but are different in alphabets, it intends to describe an example embodiment different from the example embodiment of FIGS. 1 to 3 and features described with the same reference numerals may be the same or similar.

The semiconductor device 100a of FIG. 5 is different from the semiconductor device 100 of FIGS. 1 to 3 in terms of a shape of a source/drain region 150a.

Referring to FIG. 5, the source/drain region 150a may include first to sixth epitaxial layers 151, 152a, 153a, 154a, 155a, and 156a. The second to fifth epitaxial layers 152a, 153a, 154a, 155a, and 156a may meet at a first point Pa. For example, uppermost ends of the second to fifth epitaxial layers 152a, 153a, 154a, and 155a may meet at the first point Pa. The first point Pa may be disposed on a level, lower than a level of an uppermost end of the first epitaxial layer 151 and a level of an uppermost surface of the sixth epitaxial layer 156a. The sixth epitaxial layer 156a may have a lower surface 156Ba contacting an upper surface of the fifth epitaxial layer 155a, a side surface 156S contacting an upper surface of the first epitaxial layer 151, and an upper surface 156Ta contacting an interlayer insulating layer 190.

The semiconductor device 100b of FIG. 6 is different from the semiconductor device 100 of FIGS. 1 to 3 in terms of a shape of a source/drain region 150b.

Referring to FIG. 6, the source/drain region 150b may include first to sixth epitaxial layers 151, 152b, 153b, 154b, 155b and 156b. The second and third epitaxial layers 152b and 153b may meet at a first point Pb1, and the fourth and fifth epitaxial layers 154b and 155b may meet at a second point Pb2. For example, uppermost ends of the second and third epitaxial layers 152b and 153b meet at the first point Pb1, and uppermost ends of the fourth and fifth epitaxial layers 154b and 155b meet at the second point Pb2. The first point Pb1 may be disposed on a level, lower than a level of the second point Pb2.

The fourth epitaxial layer 154b may have a lower surface 154Bb contacting an upper surface of the third epitaxial layer 153b, and a side surface 154S contacting an upper surface of the first epitaxial layer 151, and an upper surface 154Tb contacting a lower surface of the fifth epitaxial layer 155b.

The sixth epitaxial layer 156b may have a lower surface 156Bb contacting an upper surface of the fifth epitaxial layer 155b, a side surface 156S contacting an upper surface of the first epitaxial layer 151, and an upper surface 156Tb contacting an interlayer insulating layer 190.

FIG. 7 shows cross-sectional views of a semiconductor device according to example embodiments. Specifically, FIG. 7 illustrates regions, respectively corresponding to cross-sections taken along lines I-I', II-II' and III-III' of FIG. 1. For ease of description, only a group of components (e.g., major components) of the semiconductor device are illustrated in FIG. 7.

Referring to FIG. 7, a semiconductor device 100c may include an active region 105, an isolation layer 110, a source/drain region 150c, a gate structure 160, a contact plug 180, and an interlayer insulating layer 190. The semiconductor device 100c may include a FinFET device, a transistor in which an active region 105 has a fin structure. The FinFET device may include a transistor disposed around the active region 105 and the gate structure 160, intersecting each other. For example, the FinFET device may be a PMOS transistor. Hereinafter, the same reference numerals as those of FIGS. 1 to 3 denote corresponding components, and descriptions overlapping the above descriptions will be omitted.

The source/drain regions 150c may be disposed within a recess region, recessed from an upper surface of the active region 105, on at least one side of the gate structure 160. The source/drain regions 150c may include a plurality of epitaxial layers, for example, first to sixth epitaxial layers 151c, 152c, 153c, 154c, 155c, and 156c. The first to sixth epitaxial layers 151c, 152c, 153c, 154c, 155c, and 156c may be sequentially disposed in the recess region. The second to fourth epitaxial layers 152c, 153c, 154c, and 155c may be disposed below the sixth epitaxial layer 156c to reduce an aspect ratio of the sixth epitaxial layer 156c. Accordingly, dislocation or formation of voids in the source/drain region 150c may be suppressed to improve performance of the semiconductor device 100c.

FIGS. 8A to 8J are cross-sectional views illustrating a method of manufacturing a semiconductor device according to example embodiments. In some embodiments, processes illustrated in FIGS. 8A and 8J may be sequentially performed. FIGS. 8A to 8J illustrate an example embodiment of a method of manufacturing the semiconductor device of FIGS. 1 to 3, and illustrates cross-sections corresponding to FIG. 2.

Figure 8A:
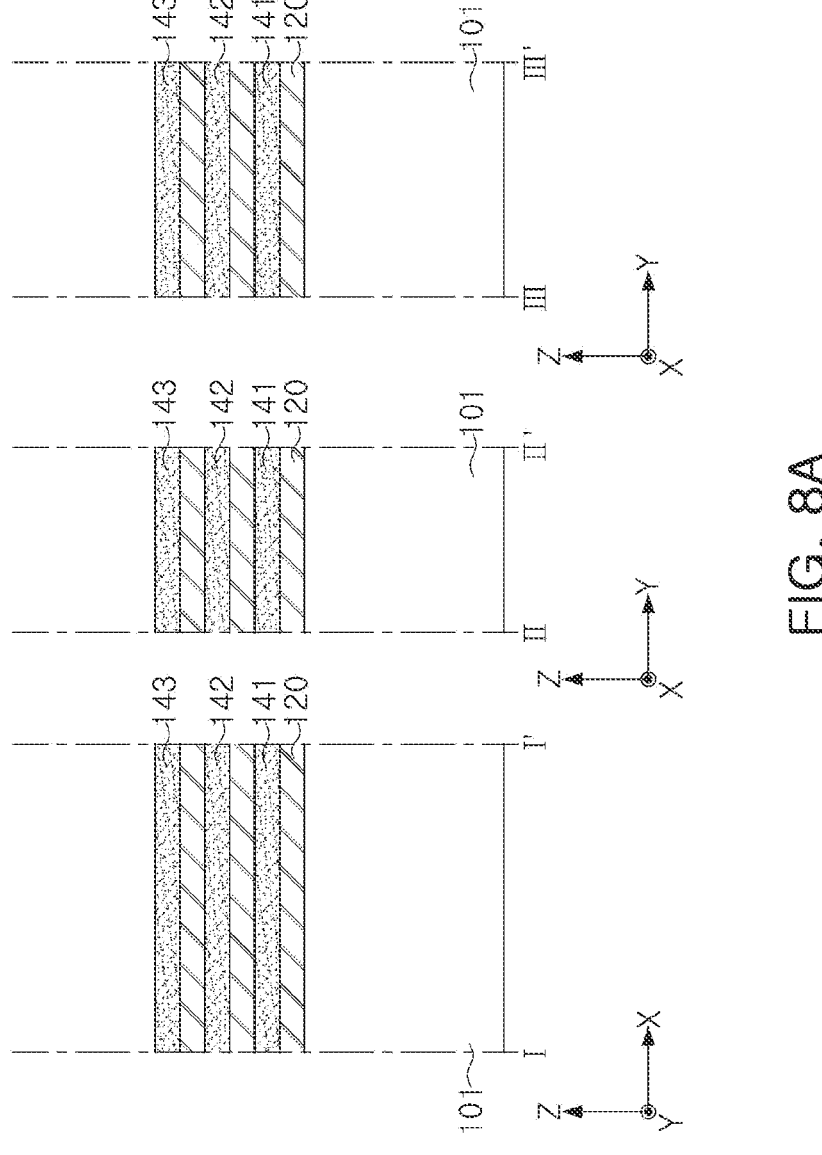

Referring to FIG. 8A, sacrificial layers 120 and channel layers 141, 142, and 143 may be alternately stacked on a substrate 101.

The sacrificial layers 120 may be replaced with a gate dielectric layer 162 and a gate electrode layer 163 through a subsequent process, as illustrated in FIG. 2. The sacrificial layers 120 may be formed of a material having etching selectivity with respect to the channel layers 141, 142, and 143. The channel layers 141, 142, and 143 may include a material, different from a material of the sacrificial layers 120. In an example embodiment, the channel layers 141, 142, and 142 may include silicon (Si), and the sacrificial layers 120 may include silicon-germanium (SiGe).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness within a range of about 1 angstrom (Å) to 100 nanometers (nm). The number of the channel layers 141, 142, and 143, stacked alternately with the sacrificial layer 120, may vary according to example embodiments.

Figure 8B:
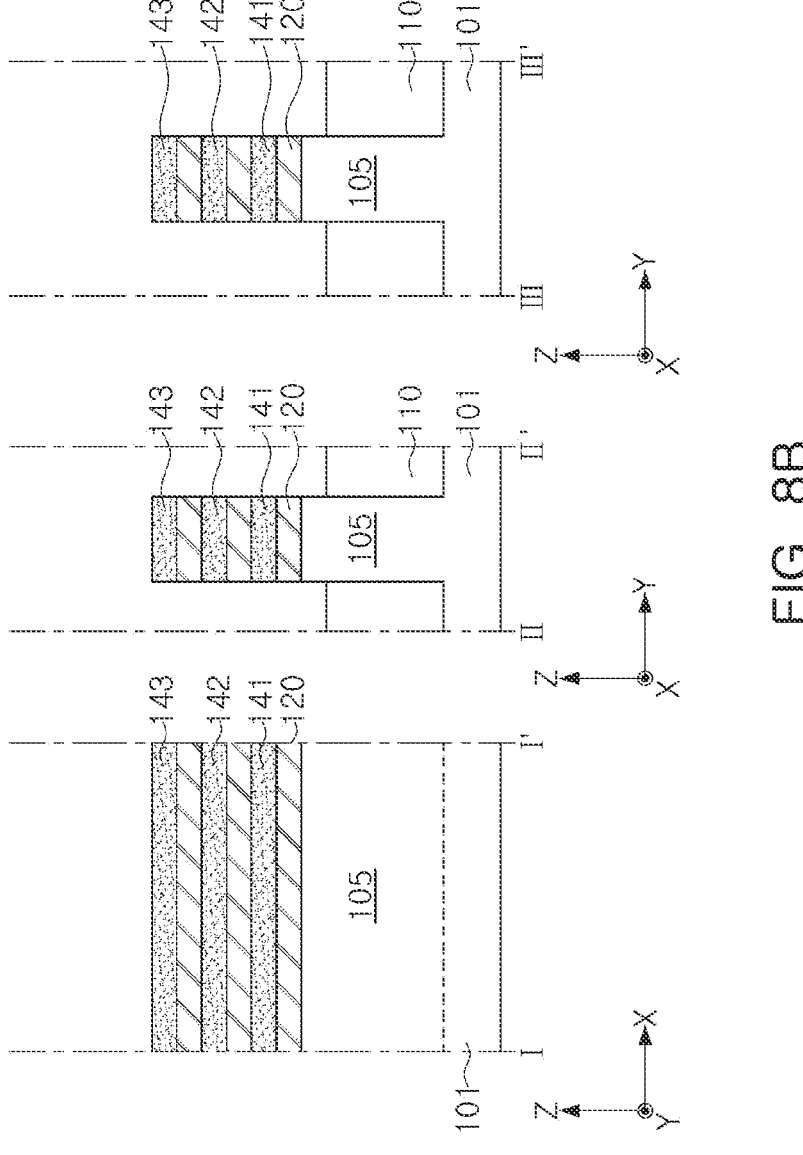

Referring to FIG. 8B, a portion of a stack structure of the sacrificial layers 120 and the channel layers 141, 142, and 143 and a portion of the substrate 101 may be removed to form active structures.

The active structure may include sacrificial layers 120 and channel layers 141, 142, and 143, stacked alternately with each other, and may further include an active region 105 formed to protrude upwardly beyond an upper surface of the substrate 101 by removing a portion of the substrate 101. The active structures may be formed to have a line shape extending in one direction, for example, an X-direction, and may be disposed to be spaced apart from each other in a Y-direction.

In a region in which a portion of the substrate 101 is removed, isolation layers 110 may be formed by filling the region with an insulating material and then recessing a resultant structure such that the active region 105 protrudes. An upper surface of the isolation layers 110 may be formed to be lower than an upper surface of the active region 105.

Figure 8C:
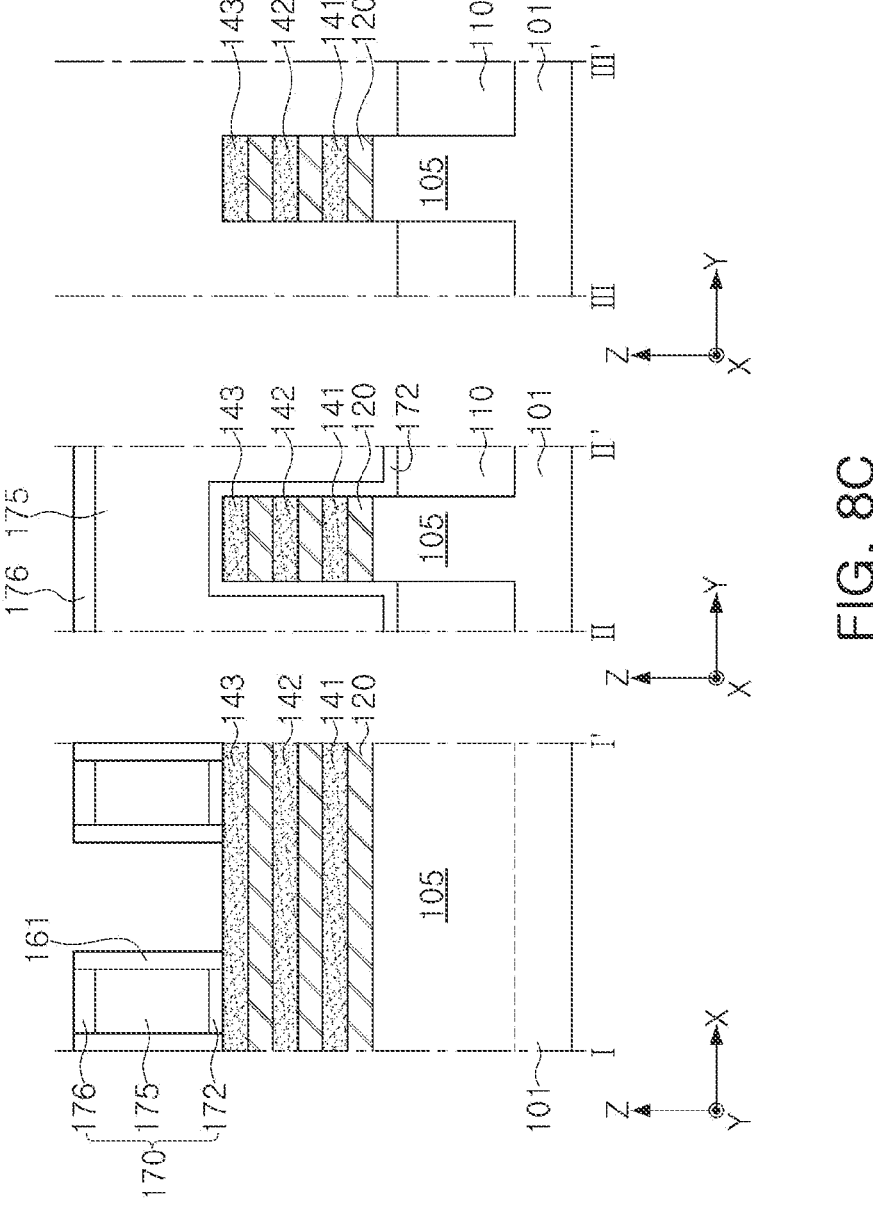

Referring to FIG. 8C, sacrificial gate structures 170 and spacer layers 161 may be formed on the active structures.

The sacrificial gate structures 170 may be sacrificial structures, formed in a region in which the gate dielectric layer 162 and the gate electrode layer 163 are disposed, on the channel structure 140 through a subsequent process as illustrated in FIG. 2. The sacrificial gate structure 170 may include first and second sacrificial gate layers 172 and 175 and a mask pattern layer 176, sequentially stacked. The first and second sacrificial gate layers 172 and 175 may be patterned using a mask pattern layer 176. The first and second sacrificial gate layers 172 and 175 may be an insulating layer and a conductive layer, respectively. For example, the first sacrificial gate layer 172 may include a silicon oxide, and the second sacrificial gate layer 175 may include polysilicon. The mask pattern layer 176 may include a silicon nitride. The sacrificial gate structures 170 may have a line shape extending in one direction and intersecting the active structures. For example, the sacrificial gate structures 170 may extend in the Y-direction, and may be disposed to be spaced apart from each other in the X-direction.

Spacer layers 161 may be formed on opposite sidewalls of the sacrificial gate structures 170. The spacer layers 161 may be formed by forming a layer having a uniform thickness along upper and side surfaces of the sacrificial gate structures 170 and the active structures and then anisotropic etching the layer. The spacer layers 161 may be formed of a low-x dielectric material or may include, for example, SiO, SiN, SiCN, SiOC, SiON, and/or SiOCN.

Figure 8D:
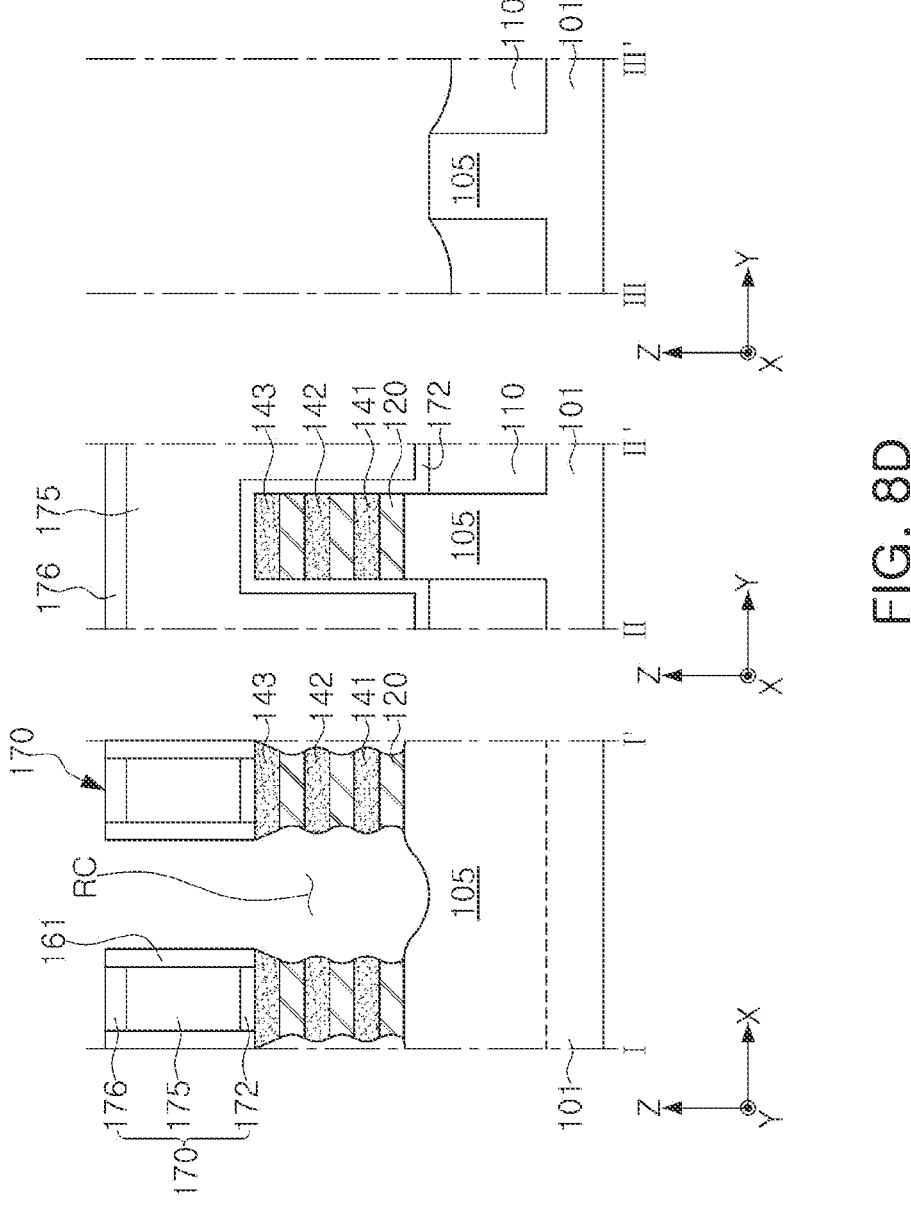

Referring to FIG. 8D, a recess region RC may be formed by removing the exposed sacrificial layers 120 and the channel layers 141, 142, and 143 between the sacrificial gate structures 170, and thus, a channel structures 140 may be formed.

The exposed sacrificial layers 120 and the channel layers 141, 142, and 143 may be removed using the sacrificial gate structures 170 and the spacer layers 161 as masks. The remaining sacrificial layers 120 may be removed to a predetermined depth from a side surface in the X-direction to have an inwardly concave side surfaces. Side surfaces of the remaining channel layers 141, 142, and 143 in the X-direction may be etched to have outwardly convex side surfaces. However, the shapes of the side surfaces of the sacrificial layers 120 and the channel layers 141, 142, and 143 are not limited to those illustrated in the drawing. Side surfaces of the sacrificial layers 120 and the channel layers 141, 142, and 143 may be formed to be coplanar with each other in a direction, perpendicular to an upper surface of the substrate 101.

Figure 8E:
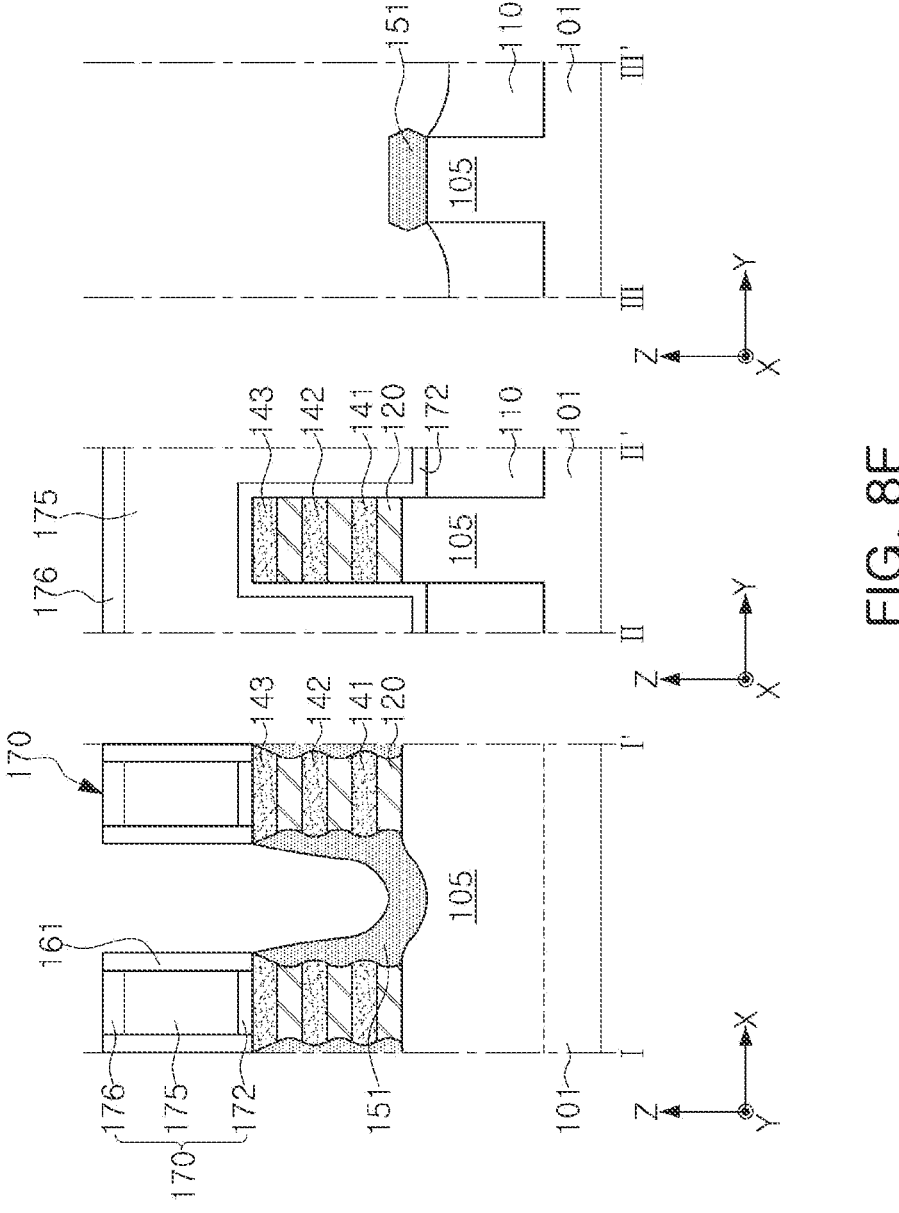

Referring to FIG. 8E, a first epitaxial layer 151 may be formed in the recess region RC.

The first epitaxial layer 151 may extend to contact the channel layers 141, 142, and 143 and the sacrificial layers 120 within the recess region RC. Accordingly, an upper surface of the first epitaxial layer 151 may be formed in a recessed shape, and may be formed to have a substantially U-shape. A surface of the first epitaxial layer 151, contacting the channel layers 141, 142, 143 and the sacrificial layers 120, may have a wavy shape. A lowermost end of the upper surface 151T of the first epitaxial layer 151 may be disposed on a level, higher than a level of a lower surface of a lowermost sacrificial layer 120.

The first epitaxial layer 151 may include silicon-germanium (SiGe). The first epitaxial layer 151 may be formed by supplying silicon (Si) and germanium (Ge) source gases while supplying a carrier gas. In an example embodiment, the carrier gas may be, for example, hydrogen ($H_2$) gas, the silicon (Si) source gas may be, for example, silane ($SiH_4$), dichlorosilane ($SiH_2Cl_2$; DCS), and/or chlorosilane ($SiH_3Cl$; MCS), and the germanium (Ge) source gas may be, for example, germanium tetrahydride ($GeH_4$). However, the carrier gas, the silicon (Si) source gas, and the germanium (Ge) source gas are not limited thereto.

The first epitaxial layer 151 may include a first germanium (Ge) concentration, lower than a Ge concentration of the sacrificial layers 120. In an example embodiment, the first epitaxial layer 151 may include Ge at a concentration of about 5 at % to about 8 at %. The first epitaxial layer 151 may include a Ge concentration, lower than the Ge concentration of the sacrificial layers 120, and may have etching selectivity, lower than etching selectivity of the sacrificial layers 120. Accordingly, in the process of FIG. 8I to be described later, the sacrificial layers 120 may be selectively removed and the source/drain regions 150 protected by the first epitaxial layer 151 may remain.

Figure 8F:
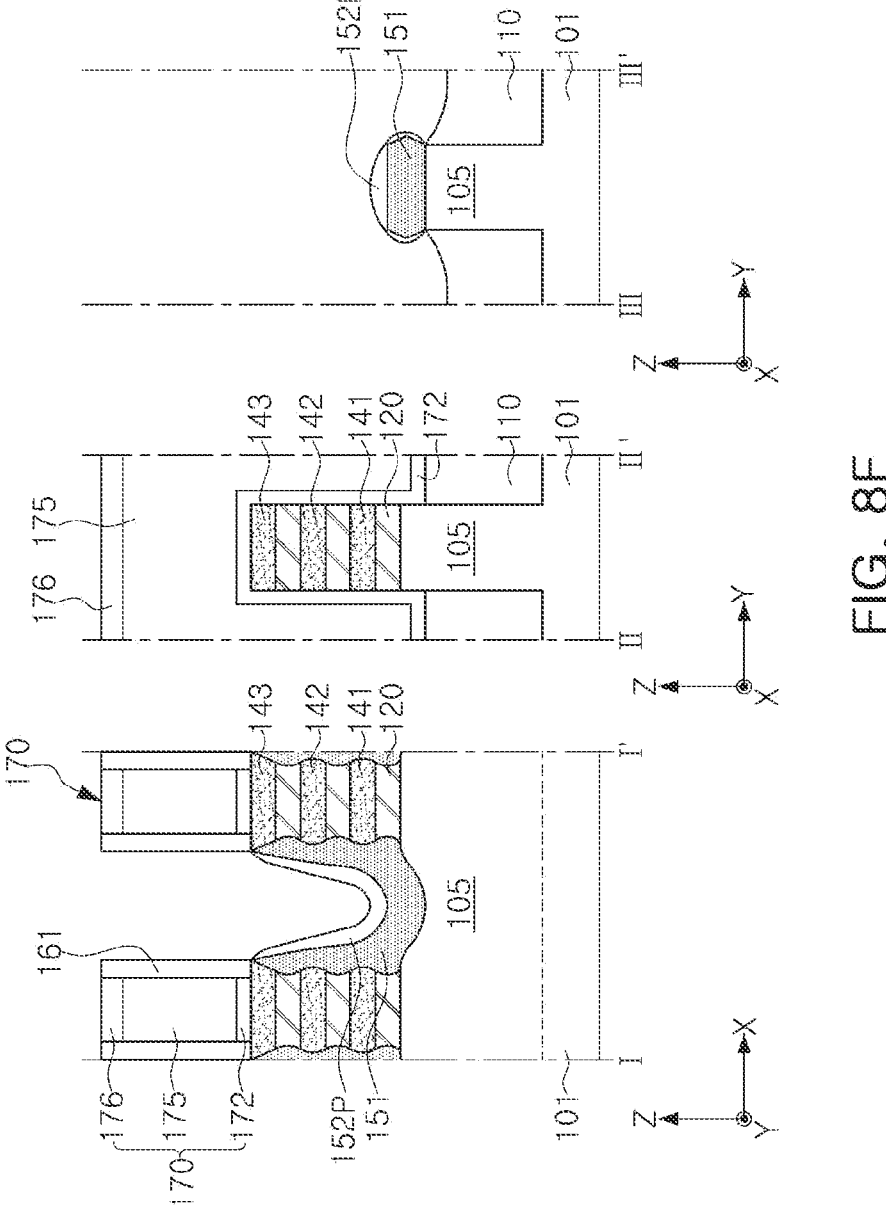

Referring to FIG. 8F, a second preliminary epitaxial layer 152P may be formed on the first epitaxial layer 151.

The second preliminary epitaxial layer 152P may be conformally formed on an upper surface of the first epitaxial layer 151 to have a substantially uniform thickness. Accordingly, an upper surface of the second preliminary epitaxial layer 152P may have a recessed shape, similar to the upper surface of the first epitaxial layer 151. The second preliminary epitaxial layer 152P may be formed to cover an entire upper surface of the first epitaxial layer 151.

The second preliminary epitaxial layer 152P may include silicon-germanium (SiGe). The second preliminary epitaxial layer 152P may be formed by supplying silicon (Si) and germanium (Ge) source gases while supplying a carrier gas. The second preliminary epitaxial layer 152P may have a second Ge concentration, higher than the first Ge concentration of the first epitaxial layer 151. In an example embodiment, the second preliminary epitaxial layer 152P may include Ge at a concentration of about 30 at % to about 70 at %.

Figure 8G:
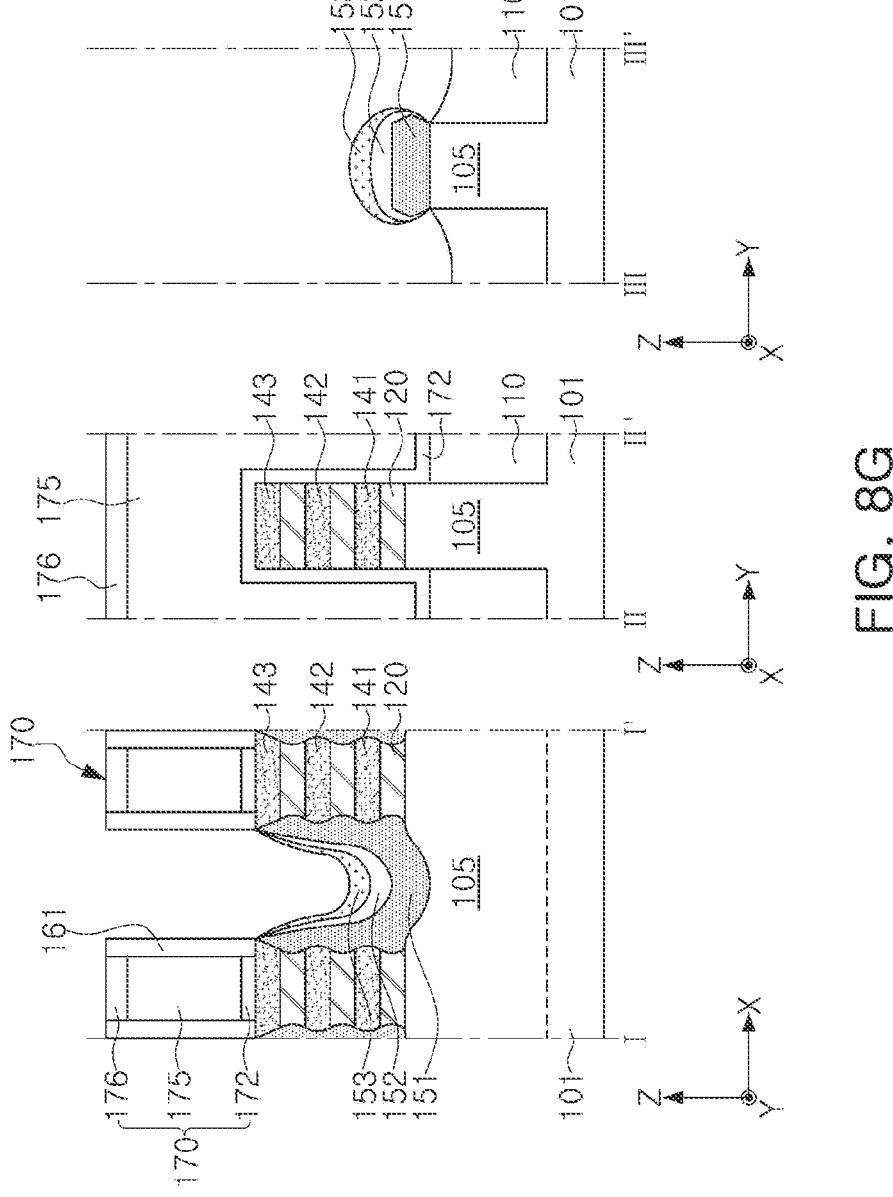

Referring to FIG. 8G, a third epitaxial layer 153 may be formed while forming a second epitaxial layer 152 by reflowing the second preliminary epitaxial layer (152P of FIG. 8F).

The second preliminary epitaxial layer (152P of FIG. 8F) may be reflowed by heat, applied in a process of forming the third epitaxial layer 153, or the like, to form the second epitaxial layer 152. The second epitaxial layer 152 may have a maximum thickness in a central portion in a first direction X.

The third epitaxial layer 153 may include silicon-germanium (SiGe). The third epitaxial layer 153 may be formed by supplying a silicon (Si) source gas while supplying a carrier gas. However, the germanium (Ge) source gas may not be supplied in a process of forming the third epitaxial layer 153. The third epitaxial layer 153 may have a third germanium (Ge) concentration due to the germanium (Ge) source gas remaining in the process of forming the second preliminary epitaxial layer (152P of FIG. 8F). The third Ge concentration of the third epitaxial layer 153 may be lower than the second Ge concentration of the second epitaxial layer 152. Accordingly, the germanium (Ge) concentration may be discontinuous in a boundary between the second epitaxial layer 152 and the third epitaxial layer 153.

Figure 8H:
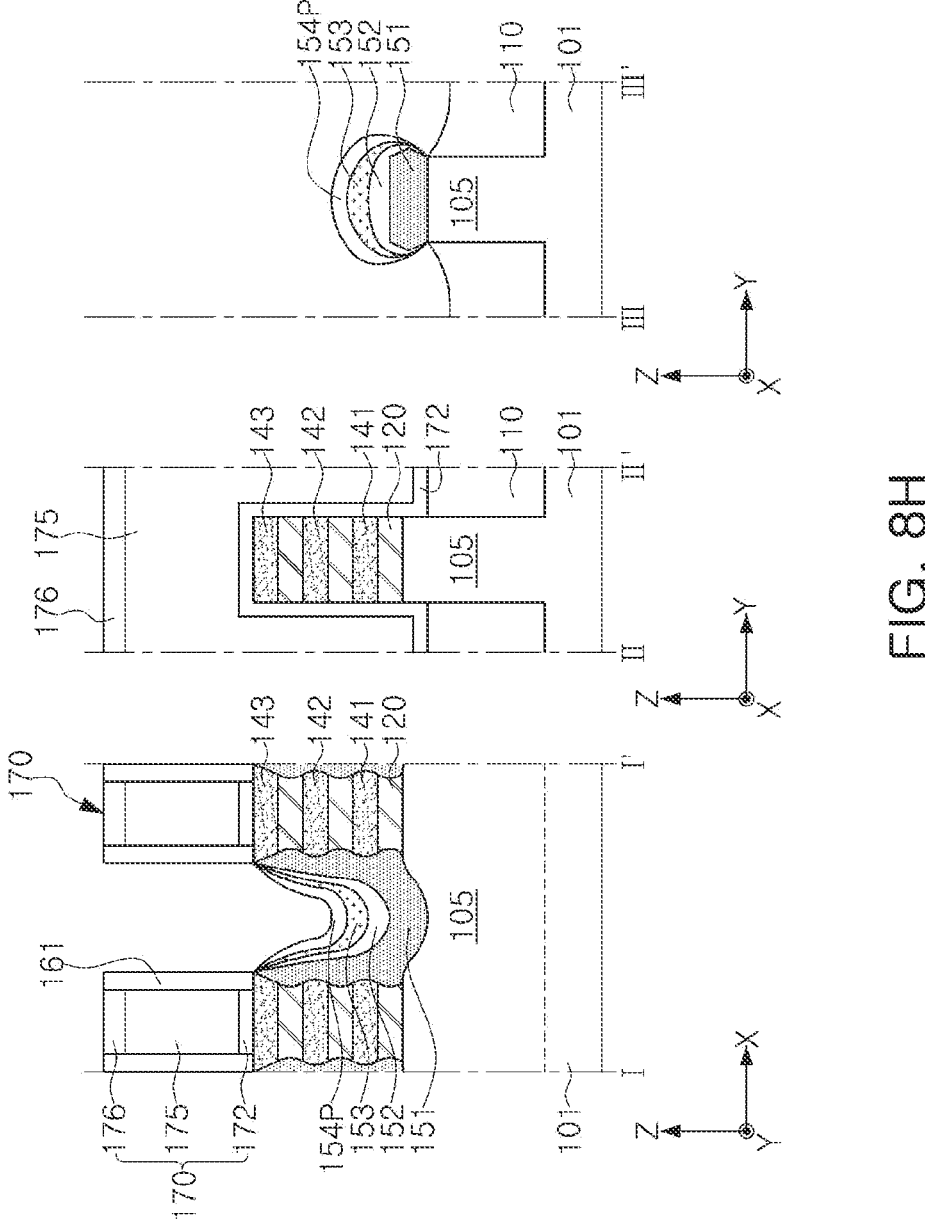
Figure 81:
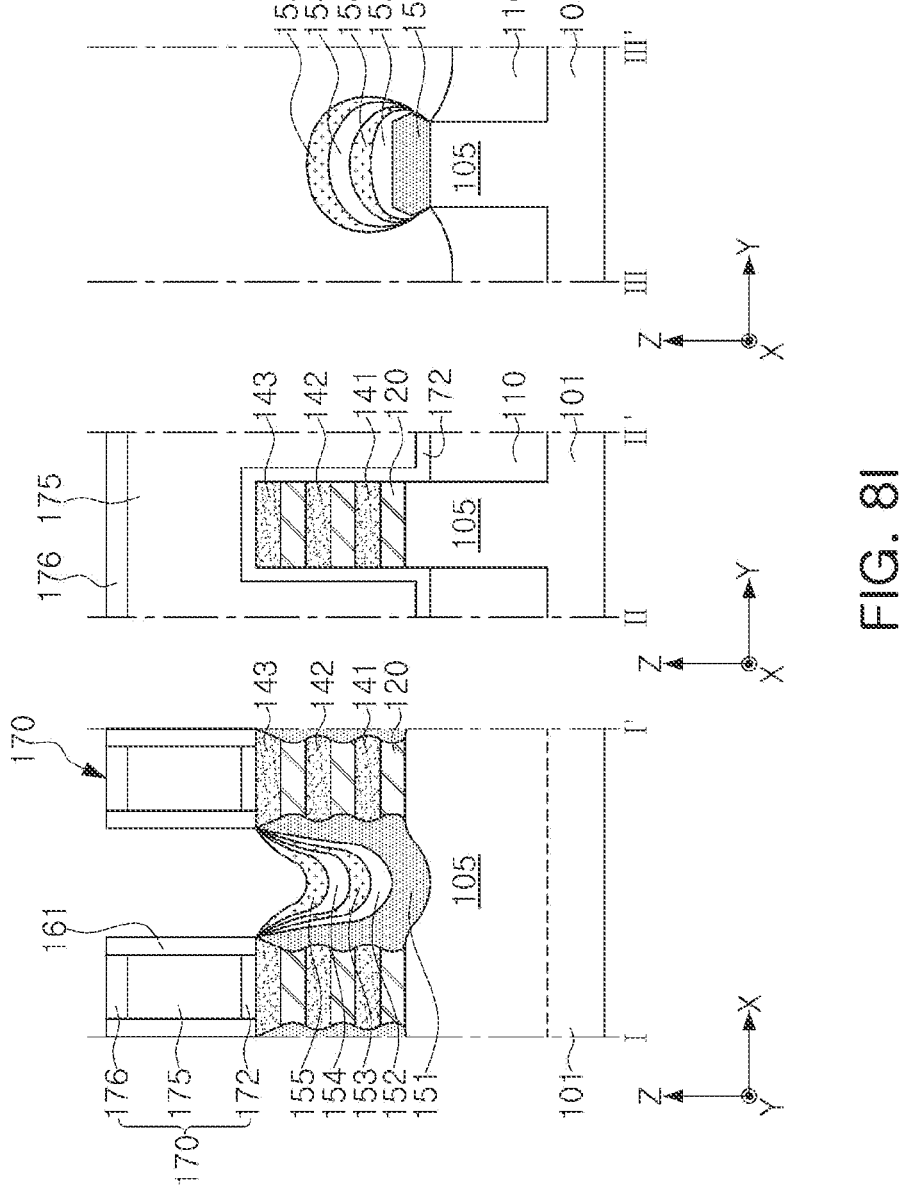

Referring to FIG. 8H, a fourth preliminary epitaxial layer 154P may be formed on the third epitaxial layer 153.

The fourth preliminary epitaxial layer 154P may be conformally formed to have a substantially uniform thickness on the upper surface of the third epitaxial layer 153. The fourth preliminary epitaxial layer 154P may be formed to cover an upper surface of the third epitaxial layer 153.

The fourth preliminary epitaxial layer 154P may include silicon-germanium (SiGe). The fourth preliminary epitaxial layer 154P may be formed by supplying silicon (Si) and germanium (Ge) source gases while supplying a carrier gas. The fourth preliminary epitaxial layer 154P may include a fourth Ge concentration, higher than the third Ge concentration of the third epitaxial layer 153. In an example embodiment, the fourth preliminary epitaxial layer 154P may include Ge at a concentration of about 30 at % to about 70 at %.

Referring to FIG. 8I, a fifth epitaxial layer 155 may be formed while forming a fourth epitaxial layer 154 by reflowing the fourth preliminary epitaxial layer (154P of FIG. 8H).

The fourth preliminary epitaxial layer (154P of FIG. 8H) may be reflowed by heat, applied in a process of forming the fifth epitaxial layer 155, or the like, to form the fourth epitaxial layer 154. The fourth epitaxial layer 154 may have a maximum thickness in a central portion in a first direction X.

The fifth epitaxial layer 155 may include silicon-germanium (SiGe). The fifth epitaxial layer 155 may be formed by supplying a silicon (Si) source gas while supplying a carrier gas. However, the germanium (Ge) source gas may not be supplied in a process of forming the fifth epitaxial layer 155. The fifth epitaxial layer 155 may have a fifth germanium (Ge) concentration due to the germanium (Ge) source gas remaining in the process of forming the fourth preliminary epitaxial layer (154P of FIG. 8H). The fifth Ge concentration of the fifth epitaxial layer 155 may be lower than the fourth Ge concentration of the fourth epitaxial layer 154. Accordingly, the germanium (Ge) concentration may be discontinuous in a boundary between the fourth epitaxial layer 154 and the fifth epitaxial layer 155.

Figure 8J:
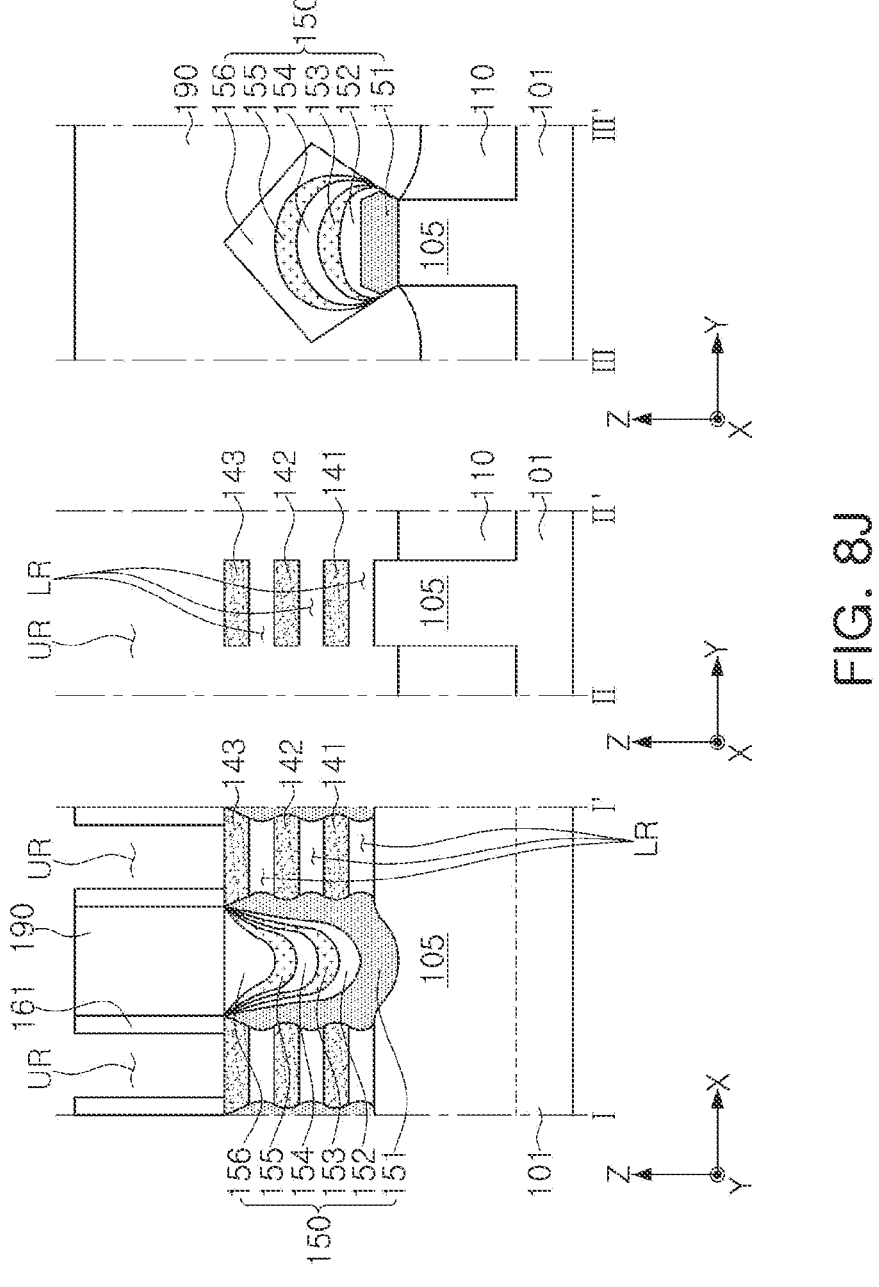

Referring to FIG. 8J, a sixth epitaxial layer 156 may be formed on the fifth epitaxial layer 155.

The sixth epitaxial layer 156 may be formed on the fifth epitaxial layer 155 to fill a gap of the fifth epitaxial layers 155. The sixth epitaxial layer 156 may be formed to cover an upper surface of the fifth epitaxial layer 155.

The sixth epitaxial layer 156 may include silicon-germanium (SiGe). The sixth epitaxial layer 156 may be formed by supplying silicon (Si) and germanium (Ge) source gases while supplying a carrier gas. The sixth epitaxial layer 156 may have a sixth Ge concentration, higher than the fifth Ge concentration of the fifth epitaxial layer 155. In an example embodiment, the sixth epitaxial layer 156 may include Ge at a concentration of about 30 at % to about 70 at %. Accordingly, the source/drain region 150 including the first to sixth epitaxial layers 151, 152, 153, 154, 155, and 156 may be formed.

Then, an interlayer insulating layer 190 may be formed between adjacent sacrificial gate structures 170 on the sixth epitaxial layer 156, and the sacrificial layers 120 and the sacrificial gate structure 170 may be removed.

The interlayer insulating layer 190 may be formed by forming an insulating layer to cover the sacrificial gate structures 170 and the source/drain region 150 and then performing a planarization process.

The sacrificial layers 120 and the sacrificial gate structures 170 may be selectively removed with respect to the spacer layers 161, the interlayer insulating layer 190, and the channel layers 141, 142, and 143. The sacrificial gate structures 170 may be removed to form upper gap regions UR, and then the sacrificial layers 120 exposed through the upper gap regions UR may be removed to form lower gap regions LR. For example, when the sacrificial layers 120 include silicon-germanium (SiGe) and the channel layers 141, 142, and 143 include silicon (Si), the sacrificial layers 120 may be selectively removed by performing a wet etching process using peracetic acid as an etchant. During the removal of the sacrificial layers 120, the source/drain regions 150 may be protected by the first epitaxial layer 151 formed in an outermost portion and having low etching selectivity.

Referring back to FIG. 2, the gate structure 160 may be formed in the upper gap regions UR and the lower gap regions LR.

The gate dielectric layer 162 may be formed to conformally cover internal surfaces of the upper gap regions UR and the lower gap regions LR. The gate electrode layer 163 may be formed to completely fill the upper gap regions UR and the lower gap regions LR. The gate electrode layer 163 and the spacer layers 161 may be removed to a predetermined depth from an upper portion in the upper gap regions UR. The gate capping layer 164 may be formed in a region in which the gate electrode layer 163 and the spacer layers 161 are removed in the upper gap regions UR. Accordingly, the gate structure 160 including the gate dielectric layer 162, the gate electrode layer 163, the spacer layers 161, and the gate capping layer 164 may be formed.

Then, the interlayer insulating layer 190 may be patterned to form a contact hole, and a conductive material may fill the contact hole to form a contact plug 180. A lower surface of the contact hole may be recessed inwardly of the source/drain regions 150. In an example embodiment, the contact plug 180 may be formed to penetrate through a portion of the sixth epitaxial layer 156. However, the shape and arrangement of the contact plug 180 are not limited thereto, and may vary according to example embodiments.

The above-described features of example embodiments may be applied, irrespective of a length of a channel, the type of a device, and the like. For example, the features of example embodiments may be applied to both a semiconductor device having a short channel and a semiconductor device having a long channel. In addition, the features of example embodiments may be applied to both a single-gate (SG) device and an extra-gate (EG) device.

As described above, a structure of a source/drain region may be controlled to provide a semiconductor device having improved electrical characteristics.

While example embodiments have been shown and described above, it will be apparent to those skilled in the art that modifications and variations could be made without departing from the scope of the present inventive concept as defined by the appended claims.

What is claimed is:

1. A semiconductor device comprising:

an active region extending in a first direction on a substrate;

a plurality of channel layers on the active region and spaced apart from each other in a vertical direction that is perpendicular to an upper surface of the substrate;

a gate structure traversing the active region and the plurality of channel layers and extending in a second direction, wherein the plurality of channel layers are in the gate structure; and a source/drain region on the active region adjacent to a side of the gate structure and contacting the plurality of channel layers, wherein the source/drain region comprises:

a first epitaxial layer on the active region, the first epitaxial layer contacting the plurality of channel layers, comprising a first upper surface and having a first germanium (Ge) concentration;

a second epitaxial layer on the first upper surface of the first epitaxial layer, the second epitaxial layer comprising a second upper surface and having a second Ge concentration that is higher than the first Ge concentration;

a third epitaxial layer on the second upper surface of the second epitaxial layer, the third epitaxial layer comprising a third upper surface and having a third Ge concentration that is lower than the second Ge concentration;

a fourth epitaxial layer on the third upper surface of the third epitaxial layer, the fourth epitaxial layer comprising a fourth upper surface and having a fourth Ge concentration that is higher than the third Ge concentration;

a fifth epitaxial layer on the fourth upper surface of the fourth epitaxial layer, the fifth epitaxial layer comprising a fifth upper surface and having a fifth Ge concentration that is lower than the fourth Ge concentration; and a sixth epitaxial layer on the fifth upper surface of the fifth epitaxial layer and in a space defined by the fifth upper surface of the fifth epitaxial layer, the sixth epitaxial layer comprising a sixth upper surface and having a sixth Ge concentration that is higher than the fifth Ge concentration, and wherein the first, second, third, fourth and fifth upper surfaces are curved toward the substrate.

2. The semiconductor device of claim 1, wherein a central portion of each of the second to fifth epitaxial layers in the first direction has a thickest thickness of each of the second to fifth epitaxial layers.

3. The semiconductor device of claim 1, wherein the substrate is equidistant from uppermost ends of the second to fifth epitaxial layers.

4. The semiconductor device of claim 3, wherein the substrate is equidistant from an uppermost end of the sixth epitaxial layer and the uppermost end of the second epitaxial layer.

5. The semiconductor device of claim 3, wherein the uppermost end of the second epitaxial layer is closer than the uppermost end of the sixth epitaxial layer to the substrate.

6. The semiconductor device of claim 5, wherein the sixth epitaxial layer further comprises a lower surface contacting the fifth upper surface of the fifth epitaxial layer and a side surface contacting the first upper surface of the first epitaxial layer.

7. The semiconductor device of claim 1, wherein uppermost ends of the second and third epitaxial layers are at a first point, and uppermost ends of the fourth and fifth epitaxial layers are at a second point that is farther than the first point from the substrate.

8. The semiconductor device of claim 7, wherein the second point is closer than an uppermost end of the sixth epitaxial layer to the substrate.

9. The semiconductor device of claim 7, wherein the fourth epitaxial layer further comprises a lower surface contacting the third upper surface of the third epitaxial layer and a side surface contacting the first upper surface of the first epitaxial layer.

10. The semiconductor device of claim 1, wherein the first Ge concentration ranges from about 5 atomic percent (at %) to about 8 at %.

11. The semiconductor device of claim 1, wherein each of the second Ge concentration, the fourth Ge concentration, and the sixth Ge concentration ranges from about 30 atomic percent (at %) to about 70 at %.

12. The semiconductor device of claim 1, wherein the fourth Ge concentration is higher than the second Ge concentration, and the sixth Ge concentration is higher than the fourth Ge concentration.

13. The semiconductor device of claim 1, wherein the fifth Ge concentration is higher than the third Ge concentration.

14. A semiconductor device comprising:

an active region extending in a first direction on a substrate;

a gate structure traversing the active region and extending in a second direction on the substrate; and a source/drain region on the active region adjacent to a side of the gate structure, wherein the source/drain region comprises:

a plurality of epitaxial layers including silicon-germanium (SiGe); and a plurality of insertion layers that include silicongermanium and are stacked alternately with the plurality of epitaxial layers, and germanium concentrations in the plurality of epitaxial layers are higher than germanium concentrations in the plurality of insertion layers, and wherein the plurality of insertion layers comprise an upper insertion layer and a lower insertion layer that is between the active region and the upper insertion layer, and the upper insertion layer has a germanium concentration that is higher than a germanium concentration in the lower insertion layer.

15. The semiconductor device of claim 14, wherein the plurality of epitaxial layers comprise an upper epitaxial layer and a lower epitaxial layer that is between the active region and the upper epitaxial layer, and the upper epitaxial layer has a germanium concentration that is higher than a germanium concentration in the lower epitaxial layer.

16. The semiconductor device of claim 14, wherein the plurality of epitaxial layers comprise an uppermost epitaxial layer that is farthest from the active region among the plurality of epitaxial layers, and the uppermost epitaxial layer has a highest germanium concentration among the plurality of epitaxial layers.

17. The semiconductor device of claim 14, wherein a number of the plurality of insertion layers is at most 50.

18. A semiconductor device comprising:

an active region extending in a first direction on a substrate;

a plurality of channel layers on the active region and spaced apart from each other in a vertical direction that is perpendicular to an upper surface of the substrate;

a gate structure traversing the active region and the plurality of channel layers, the gate structure surrounding the plurality of channel layers and extending in a second direction; and a source/drain region on the active region adjacent to a side of the gate structure and contacting the plurality of channel layers, wherein the source/drain region includes first, second, third, fourth, fifth and sixth epitaxial layers that are sequentially stacked in the vertical direction and have respective first, second, third, fourth, fifth and sixth germanium (Ge) concentrations, the first Ge concentration is lower than the second Ge concentration, the third Ge concentration is lower than the second Ge concentration and the fourth Ge concentration, and the fifth Ge concentration is lower than the fourth Ge concentration and the sixth Ge concentration.

19. The semiconductor device of claim 18, wherein each of the second Ge concentration, the fourth Ge concentration, and the sixth Ge concentration ranges from about 30 atomic percent (at %) to about 70 at %.

*    *    *    *    *